(12) United States Patent
Yim

(10) Patent No.: US 9,806,081 B2
(45) Date of Patent: Oct. 31, 2017

(54) SEMICONDUCTOR DEVICE HAVING SUB-CELL BLOCKS

(71) Applicant: Samsung ELectronics Co., Ltd., Suwon-si (KR)

(72) Inventor: Sung Soo Yim, Seoul (KR)

(73) Assignee: SAMSUNG ELECTRONICS CO., LTD., Samsung-ro, Yeongtong-gu, Suwon-si Gyeonggi-do (KR)

( * ) Notice: Subject to any disclaimer, the term of this patent is extended or adjusted under 35 U.S.C. 154(b) by 0 days.

(21) Appl. No.: 14/970,465

(22) Filed: Dec. 15, 2015

(65) Prior Publication Data

US 2016/0322361 A1    Nov. 3, 2016

(30) Foreign Application Priority Data

Apr. 30, 2015    (KR) ........................ 10-2015-0061344

(51) Int. Cl.
H01L 27/108    (2006.01)
H01L 49/02    (2006.01)

(52) U.S. Cl.
CPC .. H01L 27/10852 (2013.01); H01L 27/10894 (2013.01); H01L 27/10897 (2013.01); H01L 28/90 (2013.01)

(58) Field of Classification Search
CPC ........... H01L 27/10814; H01L 27/0207; H01L 27/10894
See application file for complete search history.

(56) References Cited

U.S. PATENT DOCUMENTS

| | | | | |
|---|---|---|---|---|
| 6,501,672 | B1* | 12/2002 | Sekiguchi | .............. G11C 5/025 257/E27.088 |
| 8,119,476 | B2 | 2/2012 | Kang et al. | |
| 8,399,916 | B2 | 3/2013 | Kadoya | |
| 8,648,440 | B2 | 2/2014 | Jie | |
| 8,815,697 | B2* | 8/2014 | Yoon | ....................... H01L 28/90 438/396 |
| 2003/0235946 | A1* | 12/2003 | Lee | ......................... H01L 28/91 438/243 |
| 2006/0034133 | A1* | 2/2006 | Sekiguchi | .............. G11C 5/063 365/190 |
| 2006/0134854 | A1* | 6/2006 | Park | ........................ H01L 28/91 438/239 |
| 2008/0108183 | A1* | 5/2008 | Ikebuchi | ................. H01L 28/91 438/128 |
| 2010/0314715 | A1 | 12/2010 | Fujimoto | |
| 2012/0153436 | A1* | 6/2012 | Hasunuma | .......... H01L 27/0207 257/532 |

(Continued)

FOREIGN PATENT DOCUMENTS

JP    2010-287716 A    12/2010
JP    2011-166071 A    8/2011

(Continued)

*Primary Examiner* — Stephen Bradley
(74) *Attorney, Agent, or Firm* — Muir Patent Law, PLLC

(57) ABSTRACT

A semiconductor device includes a substrate with cell and peripheral regions and capacitors provided on the cell region. The cell region may include a plurality of sub-cell blocks, which are spaced apart from each other by a plurality of sub-peripheral regions, and on which the capacitors are provided. Each of the sub-peripheral regions may have a width that is two to five times a distance between centers of an adjacent pair of the capacitors.

12 Claims, 33 Drawing Sheets

(56) References Cited

U.S. PATENT DOCUMENTS

2013/0005110 A1* 1/2013 Yoon .................. H01L 28/90
                                                    438/381

FOREIGN PATENT DOCUMENTS

| KR | 10-2001-0038601 A | 5/2001 |
| KR | 10-2012-0007703 A | 1/2012 |
| KR | 10-2012-0052504 A | 5/2012 |
| KR | 10-2014-0055366 A | 5/2014 |

* cited by examiner

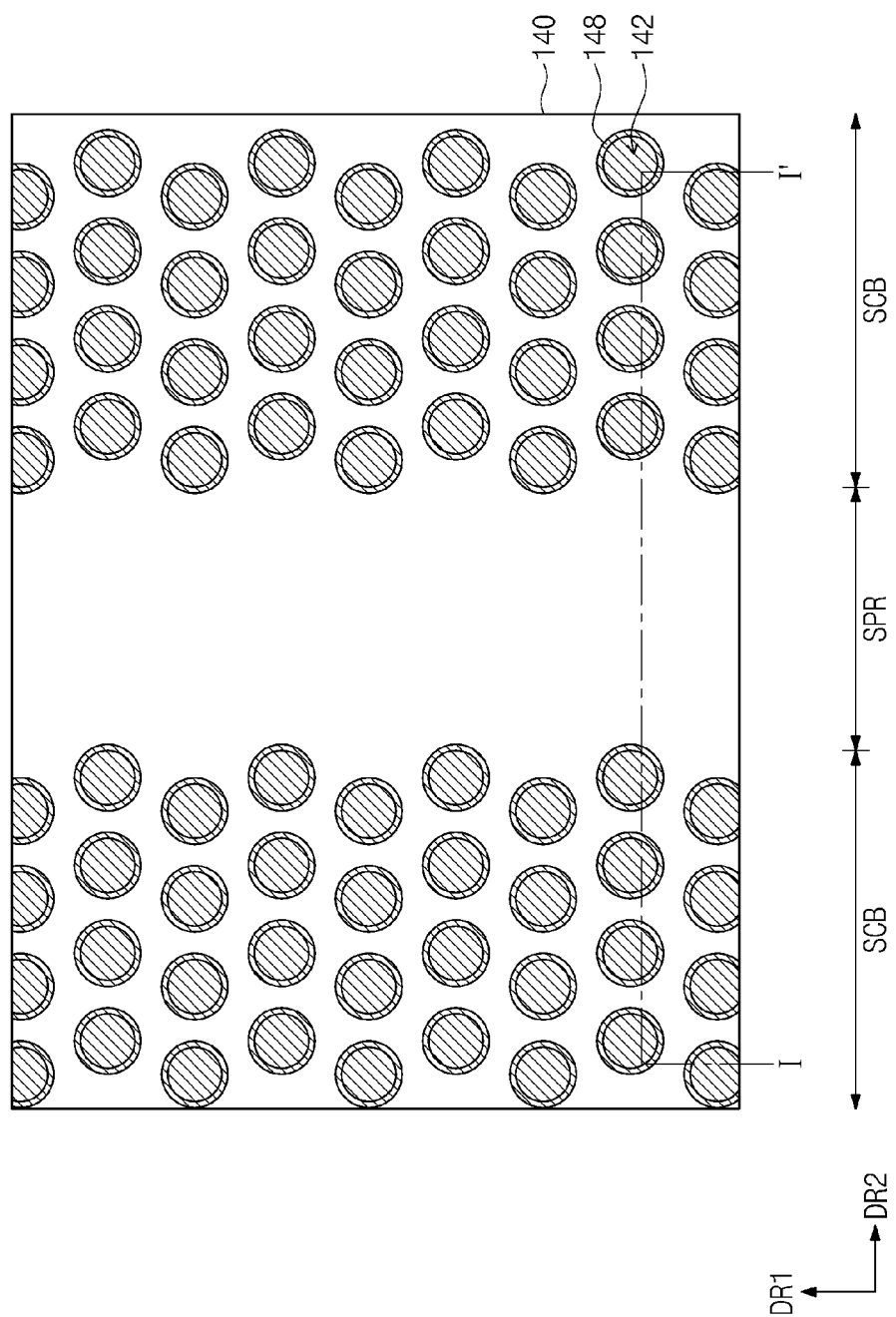

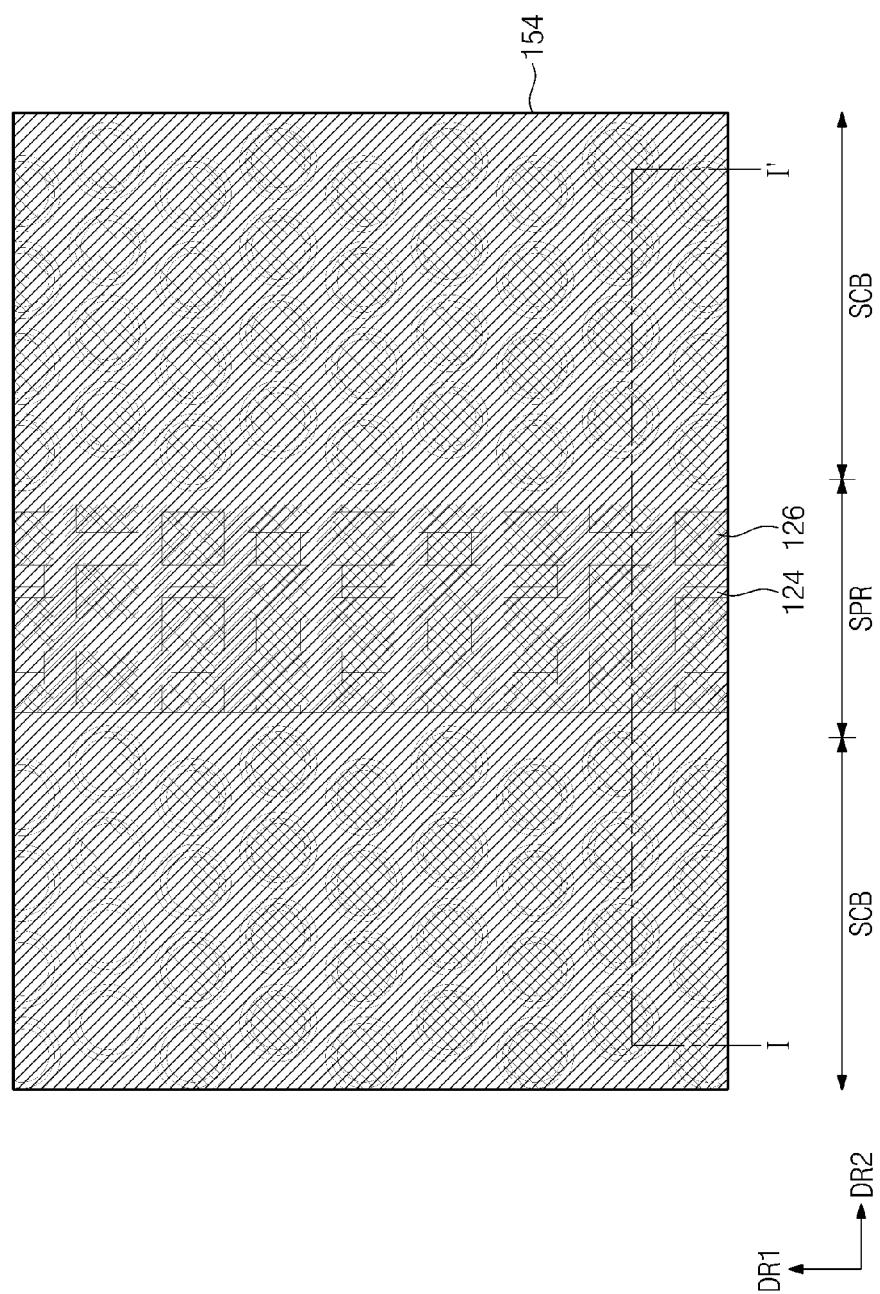

SEMICONDUCTOR DEVICE HAVING SUB-CELL BLOCKS

CROSS-REFERENCE TO RELATED APPLICATIONS

This U.S. non-provisional patent application claims priority under 35 U.S.C. §119 to Korean Patent Application No. 10-2015-0061344, filed on Apr. 30, 2015, in the Korean Intellectual Property Office, the contents of which are hereby incorporated by reference in their entirety.

BACKGROUND

1. Technical Field

The present disclosure relates to a semiconductor device having a plurality of capacitors, and in particular, to a semiconductor device with improved reliability and increased integration density.

2. Description of the Related Art

Due to their small-sized, multifunctional, and/or low-cost characteristics, semiconductor devices are widely used as important elements in the electronic industry. However, with advances in the electronic industry, semiconductor devices are becoming more and more highly integrated, and thus, many technical issues arise. For example, as an integration density of a semiconductor device increases, it is important for patterns thereof to have a decreasing line width and/or space and an increasing height and/or aspect ratio. However, this may lead to an increased difficulty in a layer deposition process, poor uniformity in an etching process, and deterioration in reliability of the semiconductor device.

SUMMARY

Example embodiments of the inventive concept provide a semiconductor device with improved reliability and an increased integration density.

According to example embodiments of the inventive concept, a semiconductor device may include a substrate including a cell region and a main peripheral region, the cell region having a plurality of sub-cell blocks spaced apart from each other by sub-peripheral regions and the main peripheral region surrounding the cell region, and a plurality of capacitors on each of the sub-cell blocks of the substrate. Each of the sub-peripheral regions may have a width that is two to five times a distance between centers of an adjacent pair of the capacitors.

In example embodiments, each of the capacitors may include a lower electrode having a bottom-closed cylindrical shape having a bottom-closed cylindrical shape, a dielectric layer conformally covering inner and outer sidewalls of the lower electrode, and an upper electrode on the dielectric layer. Here, the distance between the centers of the adjacent pair of the capacitors may be substantially equal to a distance between centers of an adjacent pair of the lower electrodes.

In example embodiments, the upper electrode may be provided to cover inner and outer sidewalls of the lower electrode provided with the dielectric layer.

In example embodiments, the semiconductor device may further include a first supporting pattern provided to support lower portions of the outer sidewalls of the lower electrodes, and a second supporting pattern provided to support upper portions of the outer sidewalls of the lower electrodes. Each of the first and second supporting patterns may have a plate-shaped structure in each of the sub-cell blocks.

In example embodiments, the dielectric layer and the upper electrode may be provided in each of the sub-cell blocks.

In example embodiments, the semiconductor device may further include a plurality of transistors on the substrate and electrically and respectively connected to the capacitors, and a plurality of bit lines. Each of the bit lines is connected to the transistors.

In example embodiments, the substrate may further include a device isolation pattern defining a plurality of active regions. Each of the transistors may include a gate electrode buried in the substrate to cross the active regions and the device isolation pattern in a first direction, a gate insulating layer provided between the gate electrode and the substrate, and first and second impurity regions in the active region and at both sides of the gate electrode, respectively.

In example embodiments, the bit lines may be electrically connected to the first impurity regions and may extend in a second direction perpendicular to the first direction.

In example embodiments, each of the capacitors may be electrically and respectively connected to the second impurity regions.

According to example embodiments of the inventive concept, a semiconductor device may include a substrate and a plurality of memory cells provided on the substrate. The substrate may include a cell region and a main peripheral region surrounding the cell region, and the cell region may include a plurality of sub-cell blocks spaced apart from each other by a plurality of sub-peripheral regions. The plurality of memory cells may be provided on each of the sub-cell blocks of the substrate.

In example embodiments, the sub-peripheral regions may be connected to the main peripheral region.

In example embodiments, each of the sub-peripheral regions may have a width that is two to five times a pitch between an adjacent pair of the memory cells.

In example embodiments, the memory cells may include capacitors, and the pitch between the adjacent pair of the memory cells may be substantially equal to a distance between centers of an adjacent pair of the capacitors.

In example embodiments, each of the capacitors may include a lower electrode having a bottom-closed cylindrical shape, a dielectric layer conformally covering inner and outer sidewalls of the lower electrode, and an upper electrode on the dielectric layer to face the inner and outer sidewalls of the lower electrode.

In example embodiments, the distance between the centers of the adjacent pair of the capacitors may be substantially equal to a distance between centers of an adjacent pair of the lower electrodes.

In example embodiments, the semiconductor device may further include a first supporting pattern provided to support lower portions of the outer sidewalls of the lower electrodes, and a second supporting pattern provided to support upper portions of the outer sidewalls of the lower electrodes. Each of the first and second supporting patterns may have a plate-shaped structure in each of the sub-cell blocks.

In example embodiments, the dielectric layer and the upper electrode may be provided in each of the sub-cell blocks.

In example embodiments, each of the memory cells may include a switching device electrically connecting a corresponding one of the capacitors to a bit line.

In example embodiments, the switching devices and the bit lines may be provided on each of the sub-cell blocks.

In example embodiments, the sub-cell blocks may have stripe-shaped structures that are provided parallel to each other, when viewed in a plan view.

According to example embodiments of the inventive concept, a semiconductor device may include a substrate having a cell region and a main peripheral region, the main peripheral region surrounding the cell region, a plurality of cell blocks in the cell region, a plurality of sub-cell blocks spaced apart from each other by a plurality of sub-peripheral regions in each of the cell blocks, a plurality of capacitors on each of the sub-cell blocks. Each of the sub-peripheral regions may have a width that is two to five times a distance between centers of an adjacent pair of the capacitors.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 3A through 16A are plan views illustrating a method of fabricating a semiconductor device, according to example embodiments of the inventive concept.

FIGS. 3B through 16B are sectional views taken along lines I-I' of FIGS. 3A through 16A, respectively.

Figure 1:
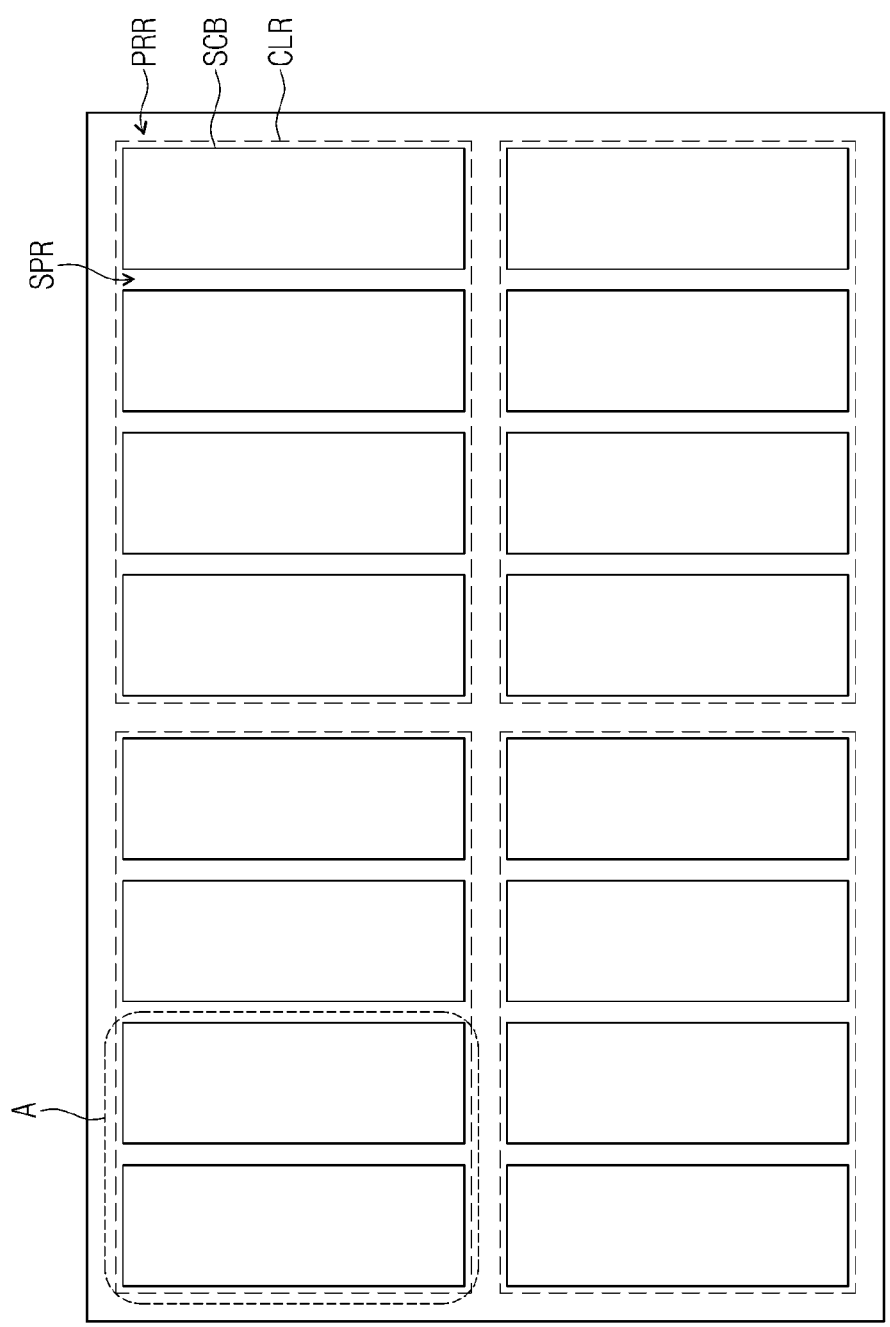
FIG. 1 is a block diagram illustrating a semiconductor device according to example embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

Also, though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" another element, there are no intervening elements present. Other words used to describe the relationship between elements or layers should be interpreted in a like fashion (e.g., "between" versus "directly between," "adjacent" versus "directly adjacent," "on" versus "directly on").

As used herein the term "and/or" includes any and all combinations of one or more of the associated listed items. It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Terms such as "equal," "same," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram illustrating a semiconductor device according to example embodiments of the inventive concept.

As used herein, a semiconductor device may refer to any of the various devices such as shown in FIGS. 1-16B, and may also refer, for example, to two transistors or a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Referring to FIG. 1, a semiconductor device may include a cell region CLR provided with a plurality of memory cells and a main peripheral region PRR provided to enclose the cell region CLR.

In example embodiments, sub-peripheral regions SPR may be provided in the cell region CLR to divide the cell region CLR into a plurality of sub-cell blocks SCB. A plurality of memory cells (not shown) may be provided in each of the sub-cell blocks SCB. To allow electrical signals to be transmitted to or from the memory cells, logic cells (not shown) may be provided in the main peripheral region PRR. As an example, cells (not shown), which are configured to provide a function similar to the logic cells of the main peripheral region PRR, may be provided in the sub-cell blocks SCB. Here, an arrangement or functions of the logic cells provided in the main peripheral region PRR may be variously changed, depending on the cells provided in the cell region CLR. In other example embodiments, the sub-peripheral regions SPR may be used for only dividing the cell region CLR into the sub-cell blocks SCB.

Figure 2:
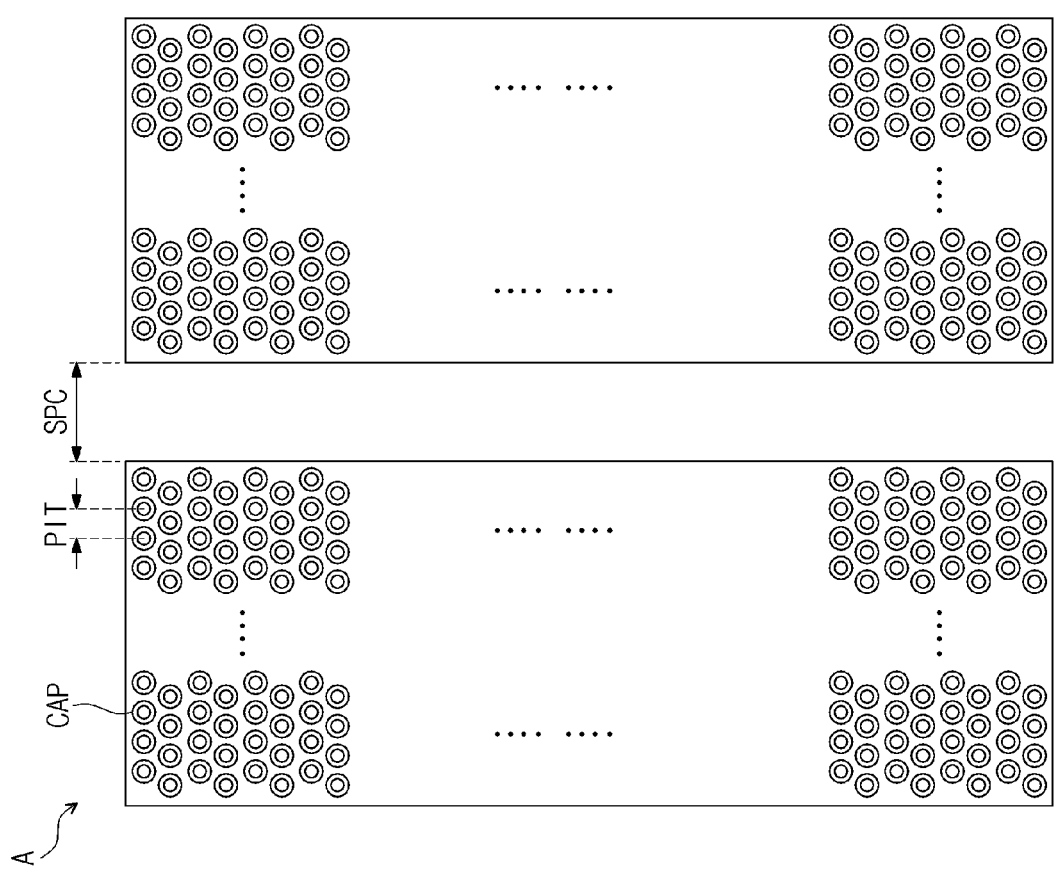
FIG. 2 is a plan view exemplarily illustrating an arrangement of capacitors according to example embodiments of the inventive concept.

FIG. 2 is a plan view exemplarily illustrating an arrangement of capacitors according to example embodiments of the inventive concept.

FIG. 2 is an enlarged plan view of a portion of the cell region CLR of FIG. 1. Hereinafter, a DRAM device will be described as an example of the semiconductor device according to example embodiments of the inventive concept. However, example embodiments of the inventive concept are not limited thereto.

Referring to FIG. 2, a plurality of capacitors CAP may be provided in each of the sub-cell blocks SCB. Although not shown in detail, each of the capacitors CAP may include a lower electrode 148 having a bottom-closed cylindrical shape (e.g., see FIG. 12B). Hereinafter, a distance between centers of an adjacent pair of the lower electrodes 148 will be called a "pitch PIT". A distance SPC between an adjacent pair of the sub-cell blocks SCB may be, larger than the pitch PIT (for example, in certain embodiments, two to five times the pitch PIT). For example, a width of each of the sub-peripheral regions SPR may be the same as the distance SPC, which may be between two and five times the pitch PIT.

FIGS. 3A through 16A are plan views illustrating a method of fabricating a semiconductor device, according to example embodiments of the inventive concept, and FIGS.

3B through 16B are sectional views taken along lines I-I' of FIGS. 3A through 16A, respectively.

Figure 3A:
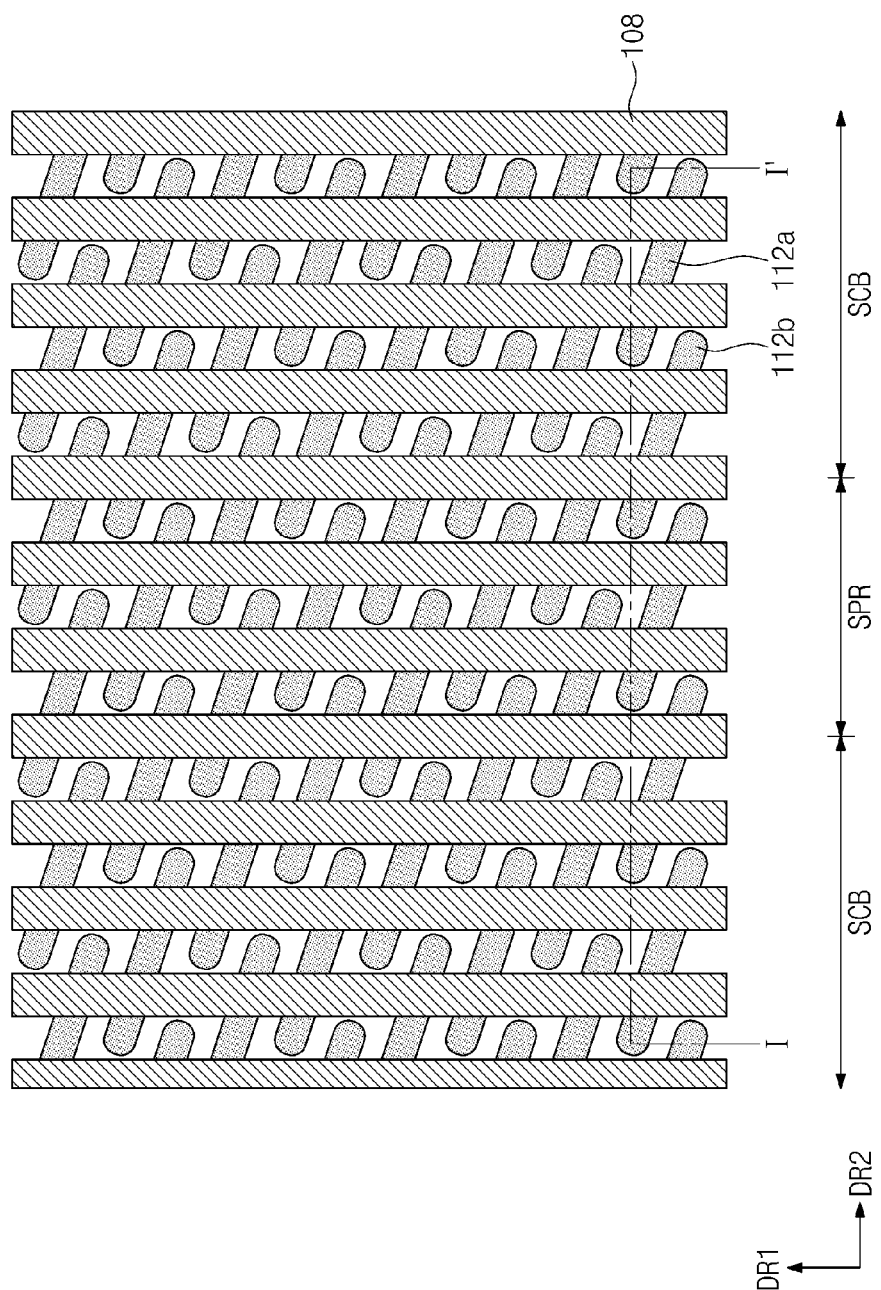
Figure 3B:
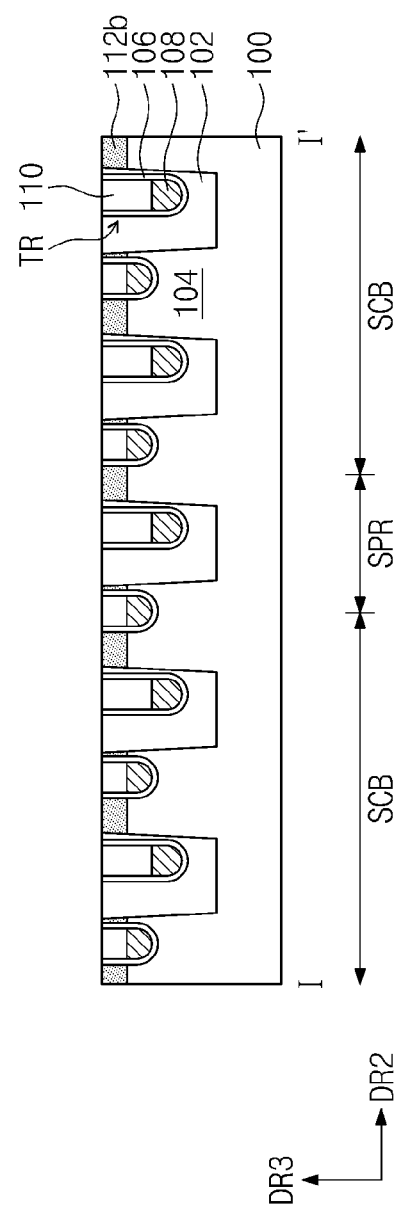

Referring to FIGS. 3A and 3B, transistors TR may be formed on a substrate 100 provided with a device isolation pattern 102.

In detail, the substrate 100 may include a sub-peripheral region SPR defining sub-cell blocks SCB. The device isolation pattern 102 defining a plurality of active regions 104 may be formed by forming a first trench (not shown) in the substrate 100 and filling the first trench with an insulating material.

Recess regions (not shown) may be formed to cross the plurality of active regions 104 and the device isolation pattern 102 in a first direction DR1, and then, a gate insulating layer 106 may be formed to conformally cover the recess regions. The gate insulating layer 106 may be formed of or include at least one of insulating materials, for example, including silicon oxide, silicon oxynitride, or metal oxides (e.g., hafnium oxide, aluminum oxide, or zirconium oxide).

Gate electrodes 108 may be formed by filling a lower portion of each of the recess regions, in which the gate insulating layer 106 is formed, with a conductive material, and then, capping patterns 110 may be formed by filling an upper portion of each of the recess regions with an insulating material. Each of the gate electrodes 108 may be formed of or include, for example, doped silicon, metals (e.g., tungsten or copper), or metal compounds (e.g., titanium nitride). Each of the capping patterns 110 may be formed of or include, for example, an insulating material (e.g., silicon nitride).

Impurities may be injected into exposed portions of the active regions 104 at both sides (e.g., opposite sides) of each of the capping patterns 110 to form first and second impurity regions 112a and 112b serving as source/drain regions of the transistors TR. Accordingly, each of the transistors TR may be formed to include the gate insulating layer 106, the gate electrode 108, and the first and second impurity regions 112a and 112b. According to some aspects of the inventive concept, the transistor TR may be a buried channel array transistor (BCAT), whose channel region is formed in the substrate 100.

In one embodiment, the transistor TR is described to have a BCAT structure, but example embodiments of the inventive concept are not limited thereto. For example, the transistor TR may be provided in the form of a recessed channel array transistor (RCAT), a planar-type transistor, or a fin-type transistor.

In one embodiment, the device isolation pattern 102 and the transistors TR are illustrated to be formed in the sub-peripheral region SPR, but, in other example embodiments, the device isolation pattern 102 and the transistors TR may not be formed in the sub-peripheral region SPR or logic cells may be formed in the sub-peripheral region SPR.

Figure 4A:
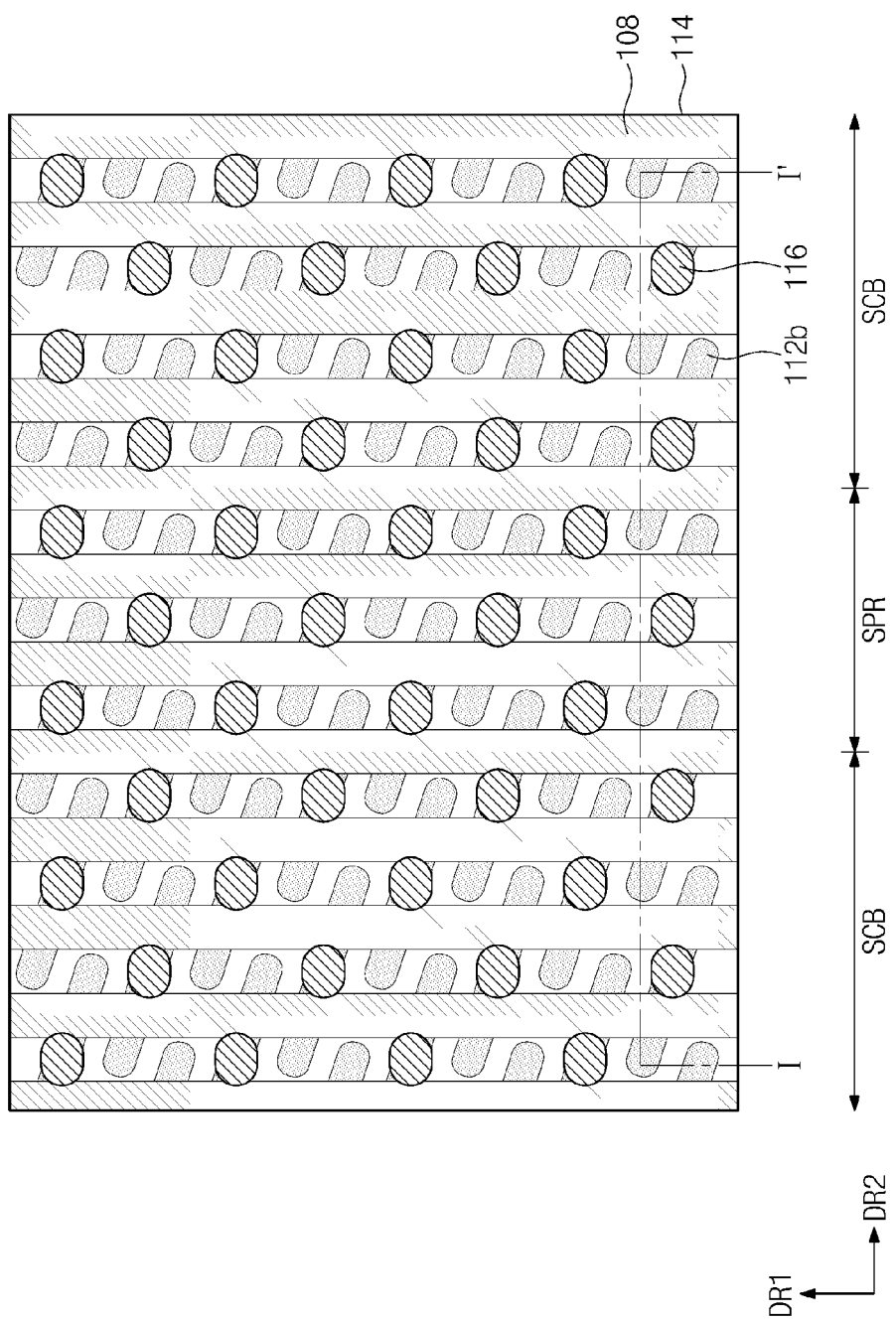
Figure 4B:
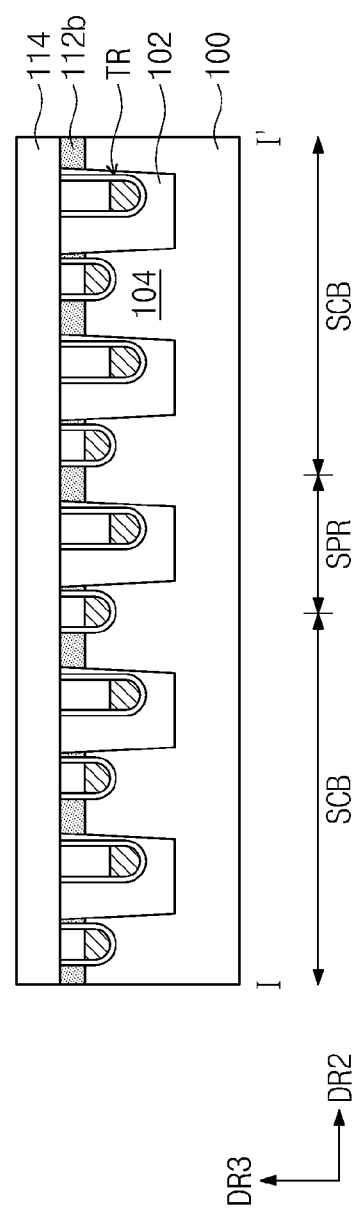

Referring to FIGS. 4A and 4B, first contact plugs 116 may be formed to be electrically connected to the first impurity regions 112a. As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. On the contrary, a passive electrically conductive component directly physically connected to a source, drain, gate, channel, or doped semiconductor material through which signals may pass, is electrically connected to that source, drain, gate, channel, or doped semiconductor material. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes.

In detail, a first interlayered insulating layer 114 may be formed on the substrate 100 provided with the transistors TR and may be patterned to form first contact holes (not shown) exposing the first impurity regions 112a. The first interlayered insulating layer 114 may be formed of or include, for example, at least one of, for example, silicon oxide, silicon nitride, or silicon oxynitride. The first contact plugs 116 may be formed by filling the first contact holes with a conductive material. Here, the conductive material may include, for example, doped silicon, metals (e.g., tungsten or copper), or metal compounds (e.g., titanium nitride).

Although not shown, an insulating spacer may be further formed on inner sidewalls of the first contact holes, before the formation of the conductive material.

Figure 5A:
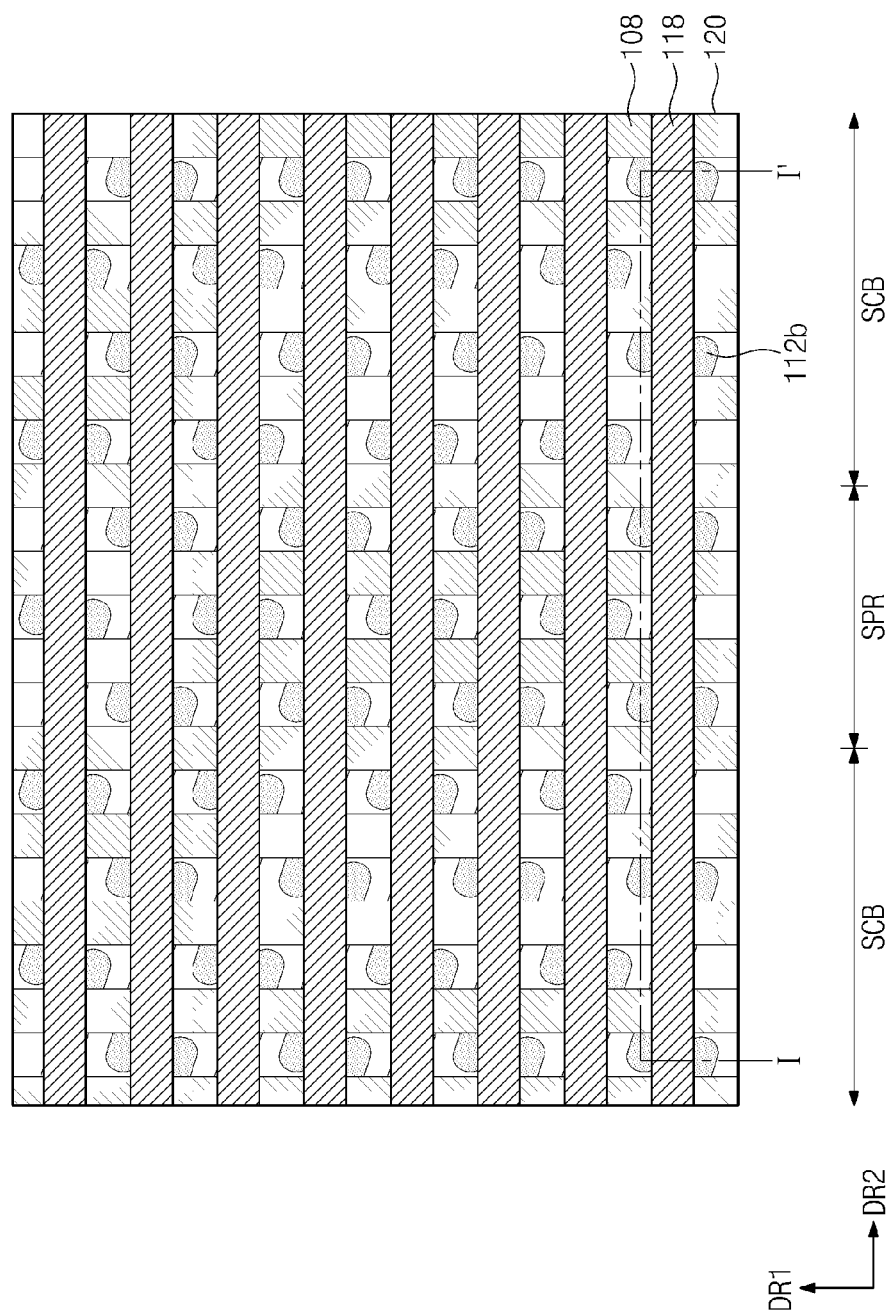
Figure 5B:
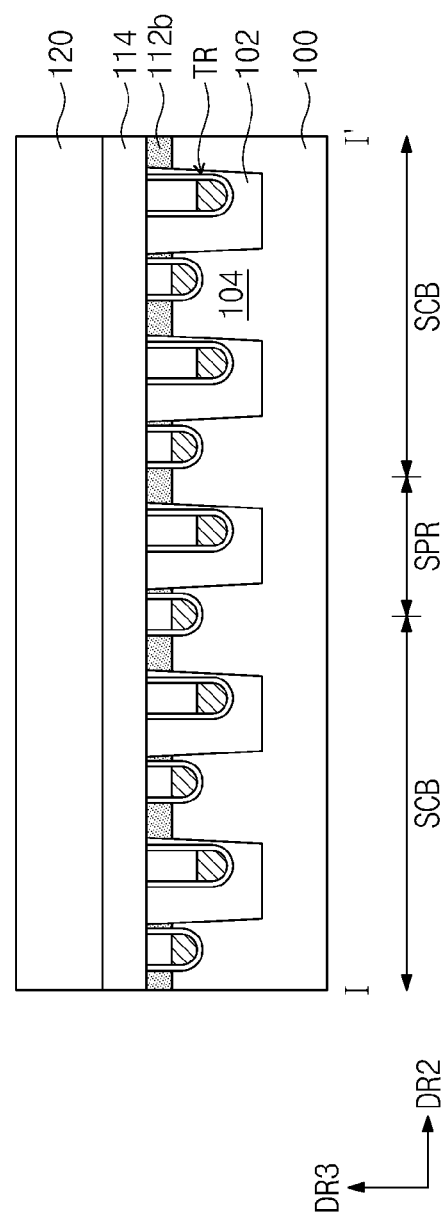

Referring to FIGS. 5A and 5B, bit lines 118 may be formed to be electrically connected to the first contact plugs 116.

In detail, the bit lines 118 may be formed on the first interlayered insulating layer 114 provided with the first contact plugs 116 to electrically connect the first contact plugs 116, which are arranged in a second direction DR2 perpendicular to the first direction DR1, to each other. Each of the bit lines may include doped silicon, metals (e.g., tungsten or copper), or metal compounds (e.g., titanium nitride).

Although not shown in detail, a capping pattern may be formed on each of the bit lines 118, and an insulating spacer may be formed on sidewalls of the bit line 118 and the capping pattern.

Next, a second interlayered insulating layer 120 may be formed on the first interlayered insulating layer 114 to cover the bit lines 118. The second interlayered insulating layer 120 may be formed of or include at least one of, for example, silicon oxide, silicon nitride, or silicon oxynitride.

In one embodiment, the first contact plugs 116 and the bit lines 118 are illustrated to be formed in the sub-peripheral region SPR, but, in other example embodiments, the first contact plugs 116 and the bit lines 118 may not be formed in the sub-peripheral region SPR or logic cells may be formed in the sub-peripheral region SPR.

Figure 6A:
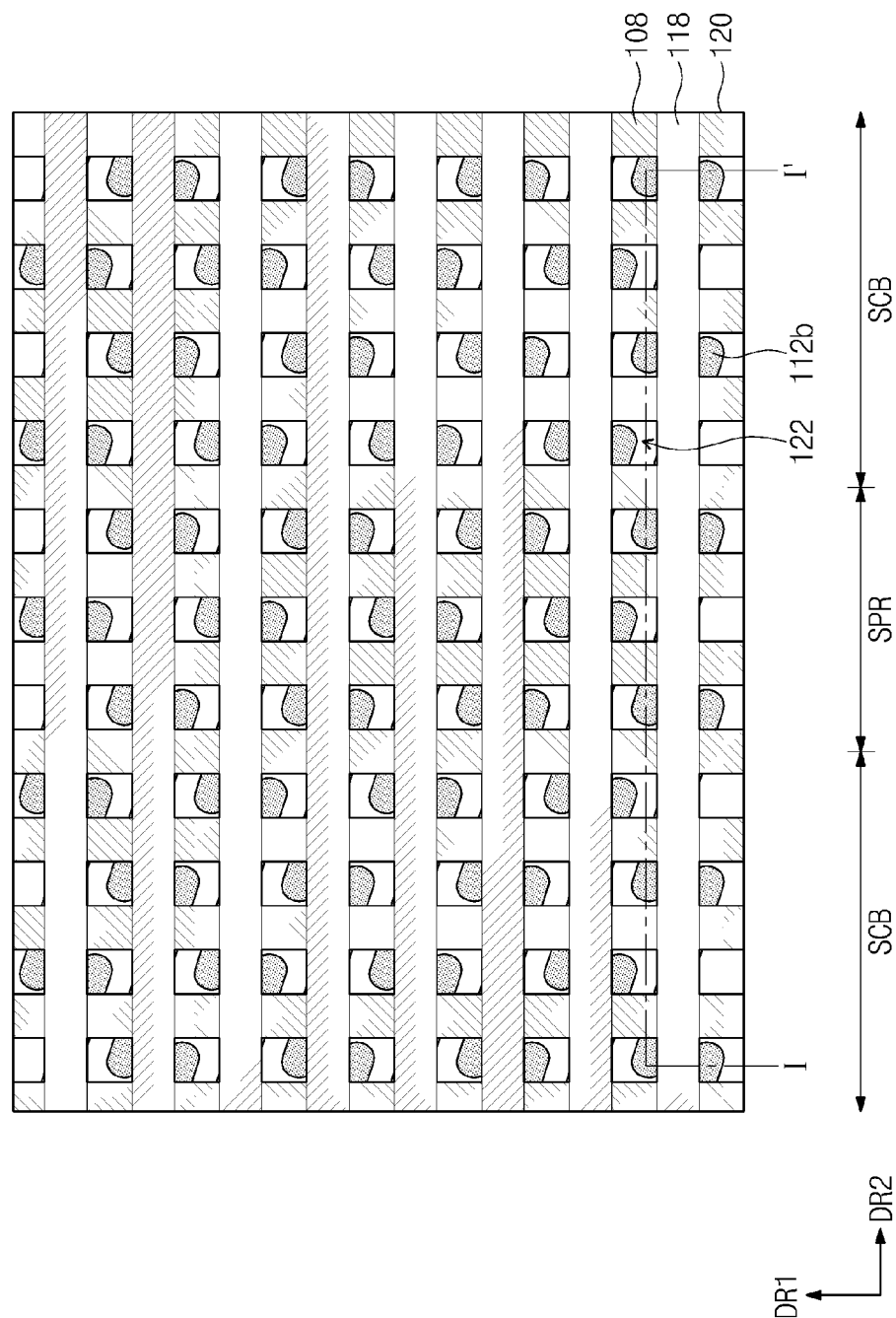
Figure 6B:
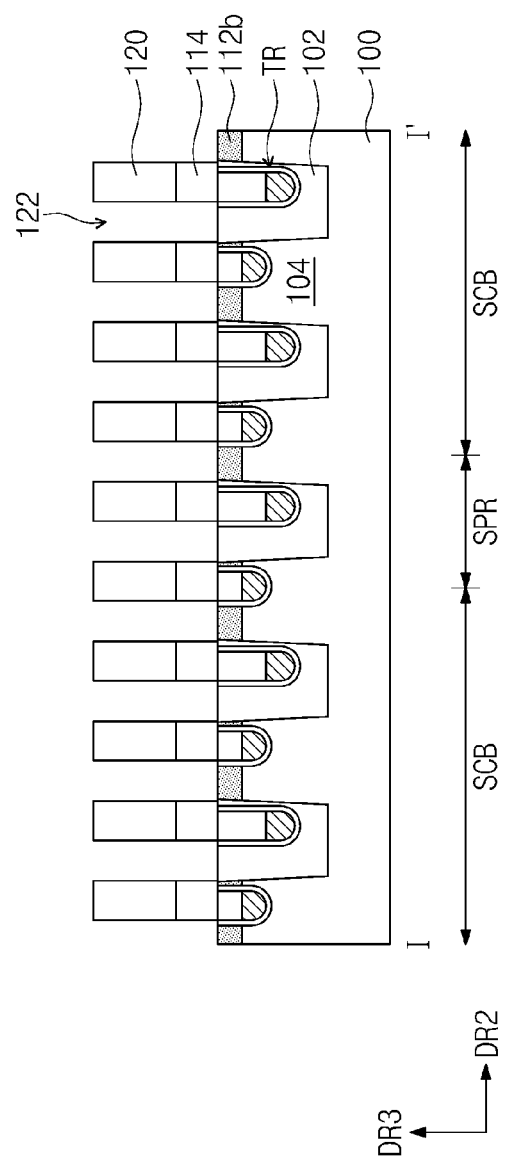

Referring to FIGS. 6A and 6B, the first and second interlayered insulating layers 114 and 120 may be patterned to form second contact holes 122 exposing the second impurity regions 112b.

Figure 7A:
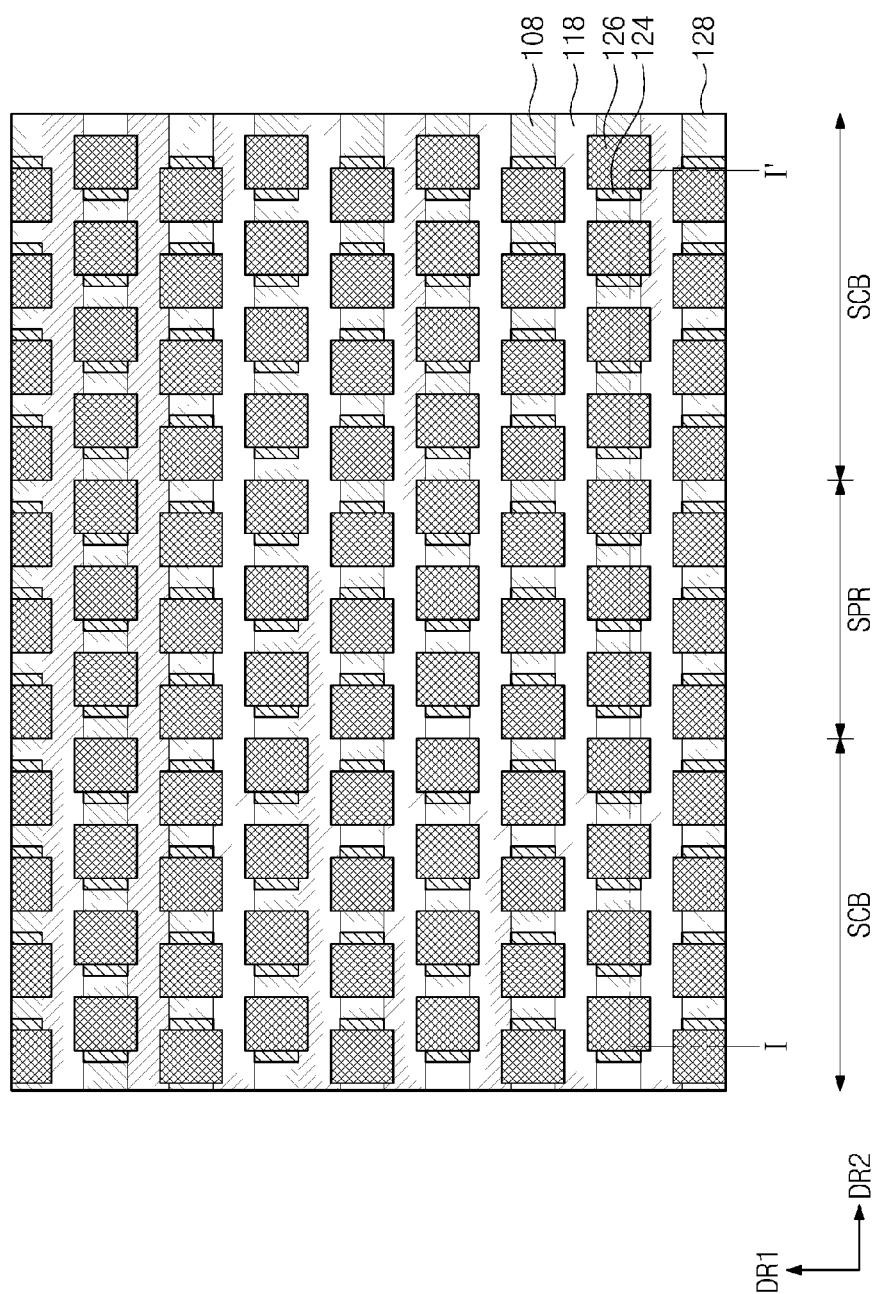
Figure 7B:
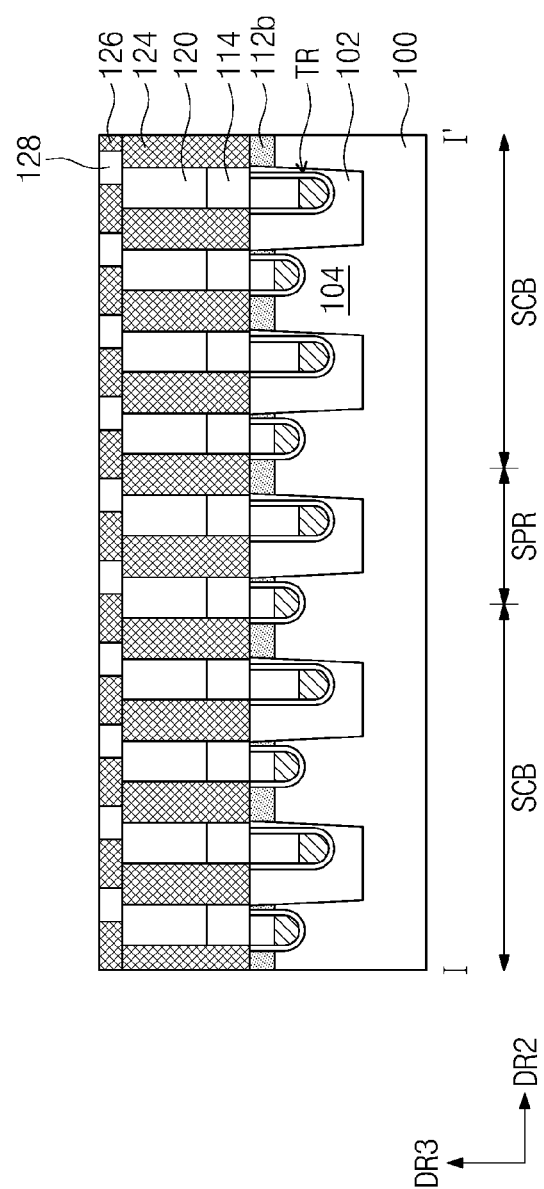

Referring to FIGS. 7A and 7B, a conductive material may be deposited to form second contact plugs 124 filling the second contact holes 122, and then, contact pads 126 may be formed to be electrically connected to the second contact plugs 124, respectively.

For example, the conductive material may be formed to fill the second contact holes 122 exposing the second impurity regions 112b, and thus, the second contact plugs 124 may be formed in the second contact holes 122, respectively. Here, the conductive material may include, for example, doped silicon, metals (e.g., tungsten or copper), or metal compounds (e.g., titanium nitride). The second impurity regions 112b may be electrically connected to the second contact plugs 124, respectively.

In order to improve area efficiency in a subsequent process for forming the capacitors CAP, each of the contact pads 126 may be shifted or offset with respect to a corresponding one of the second contact plugs 124. For example, the contact pads 126 may be formed to constitute a plurality of columns, each of which extends parallel to the second direction DR2 and includes a plurality of the contact pads 126. Here, when viewed in a plan view, each of the contact pads 126 constituting odd-numbered columns is offset from a center of a corresponding one of the second contact plugs 124 to the right, and each of the contact pads 126 constituting even-numbered columns is offset from a center of a corresponding one of the second contact plugs 124 to the left.

Thereafter, a third interlayered insulating layer 128 may be formed to cover the contact pads 126. The third interlayered insulating layer 128 may be formed of or include at least one of, for example, silicon oxide, silicon nitride, or silicon oxynitride.

Figure 8A:
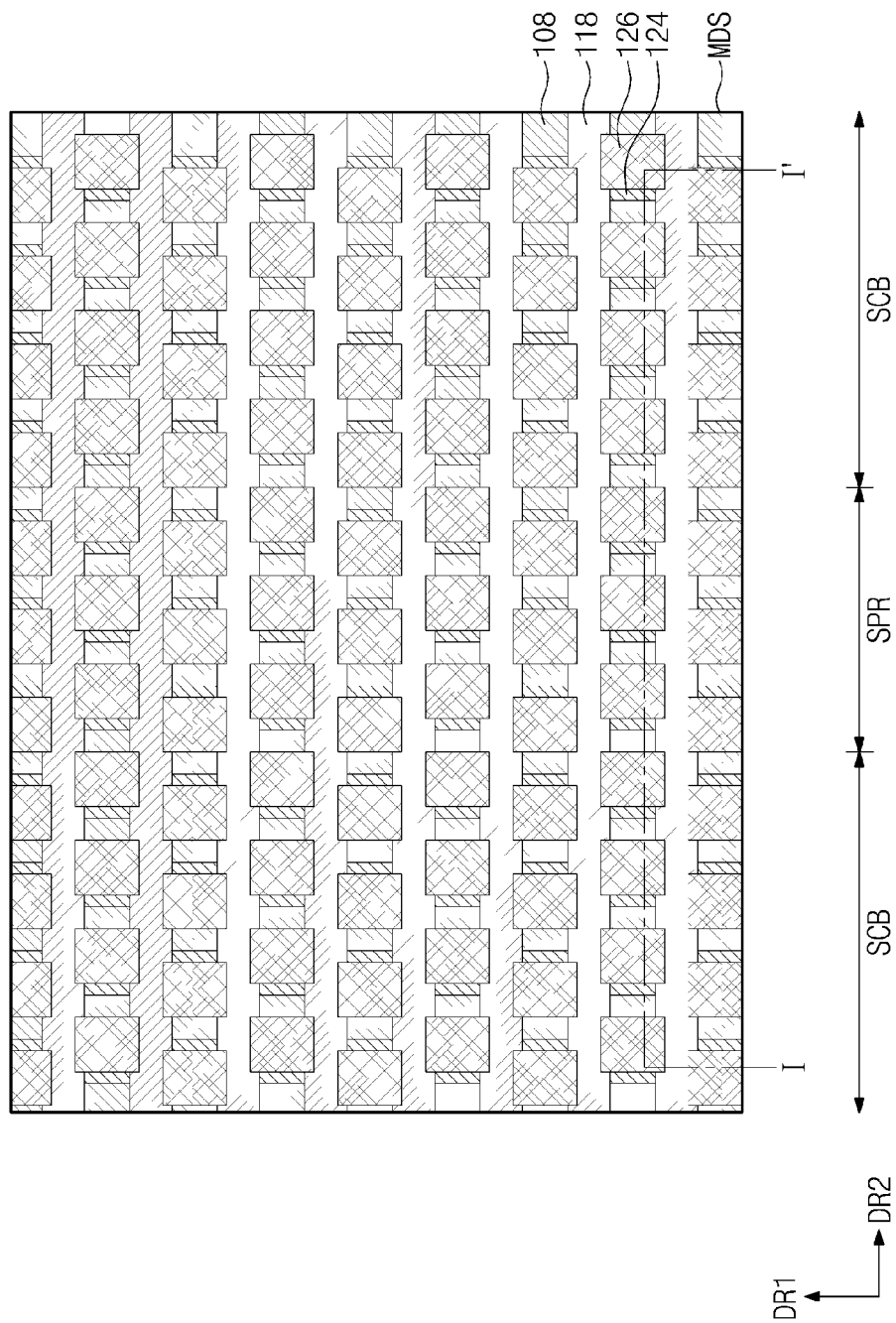
Figure 8B:
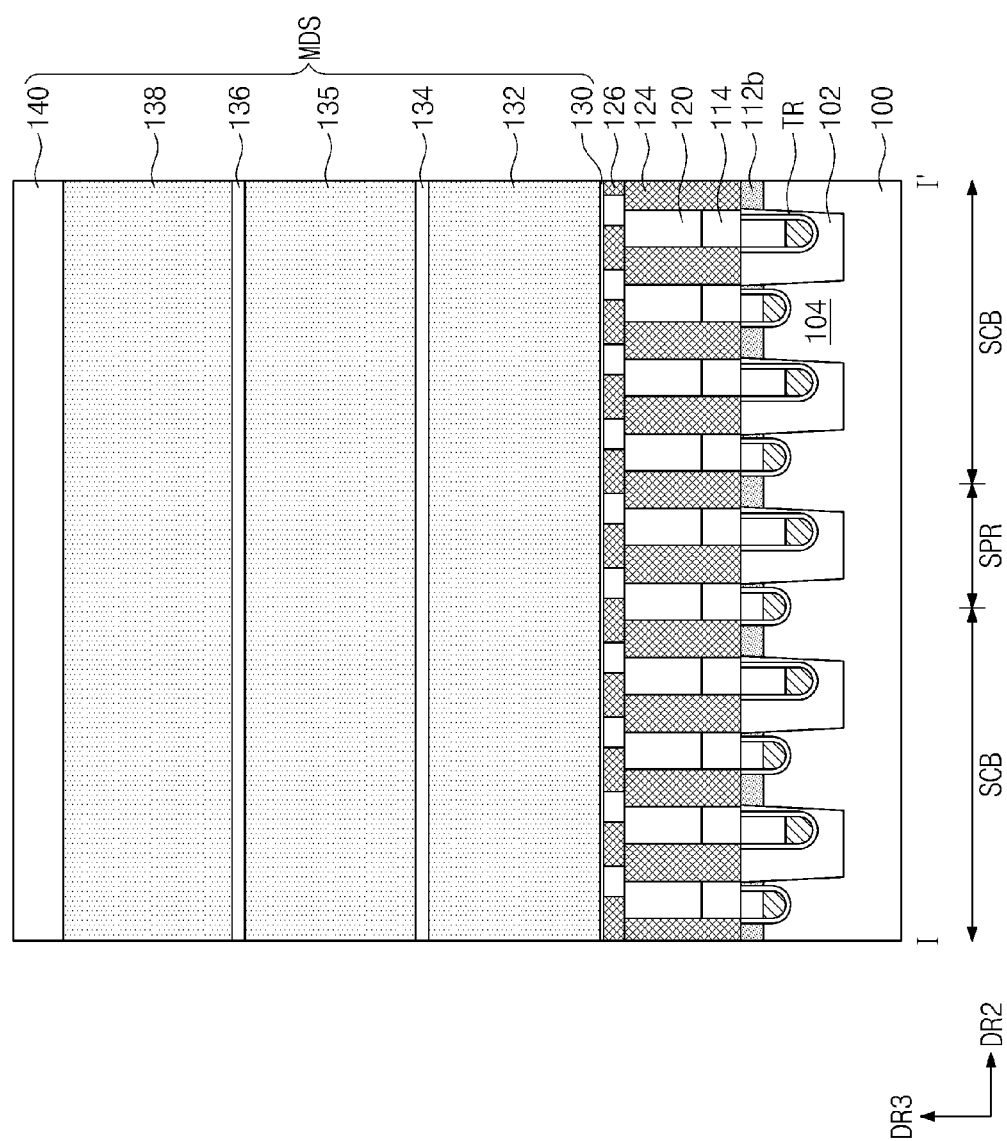

Referring to FIGS. 8A and 8B, a mold structure MDS may be formed on the third interlayered insulating layer 128 and the contact pads 126.

For example, the mold structure MDS may include an etch stop layer 130, a first sacrificial layer 132, a first supporting layer 134, a second sacrificial layer 135, a second supporting layer 136, a third sacrificial layer 138, and a third supporting layer 140, which are sequentially stacked on the third interlayered insulating layer 128. In example embodiments, the third supporting layer 140 may be formed to have a thickness greater than those of the first and second supporting layers 132 and 136.

The first to third sacrificial layers 132, 135, and 138 may include at least one of oxide-based materials (e.g., silicon oxide), and the first to third supporting layers 134, 136, and 140 may include at least one of nitride-based materials (e.g., silicon nitride).

Although, in the present embodiment, three supporting layers are illustrated, the number of the supporting layers is not limited thereto.

Figure 9A:
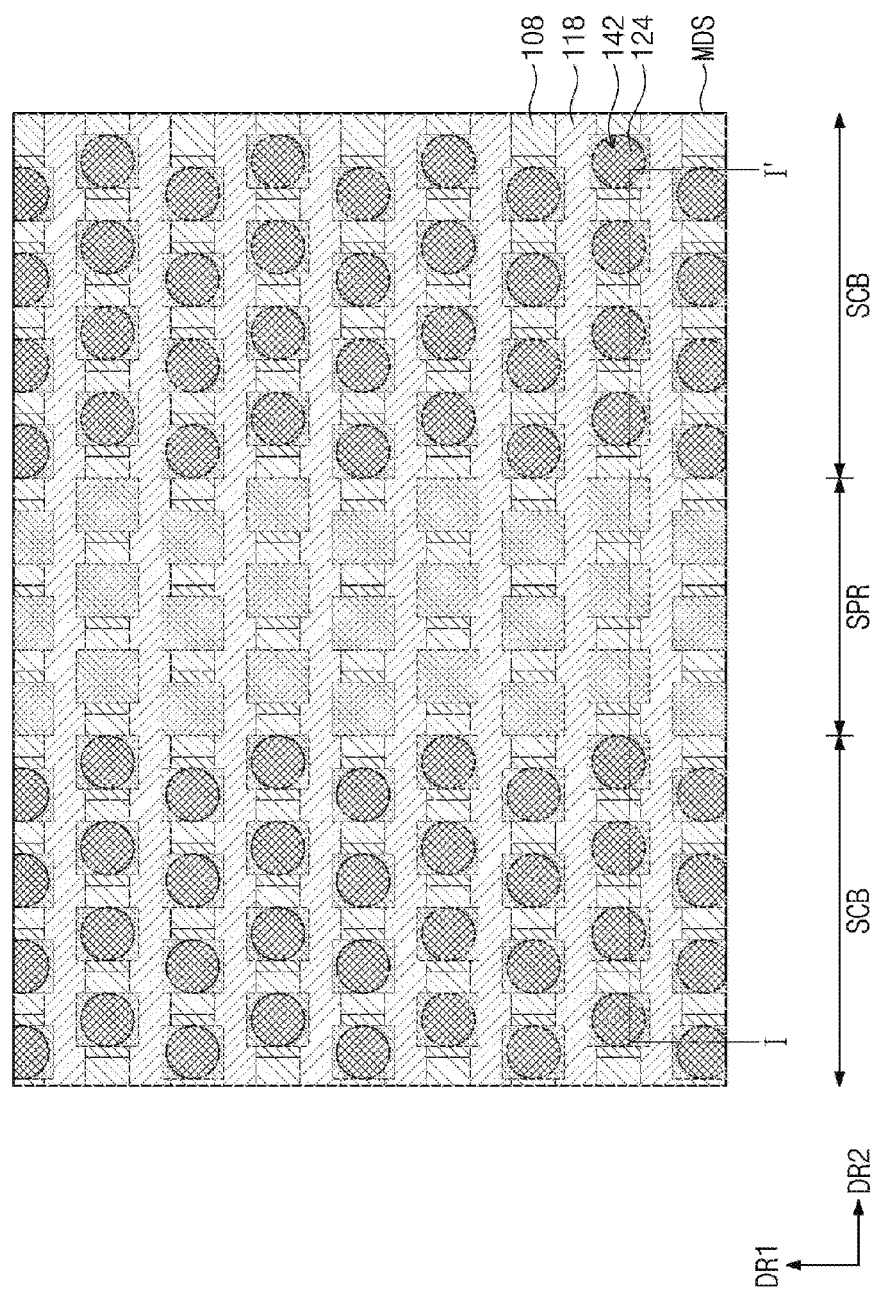
Figure 9B:
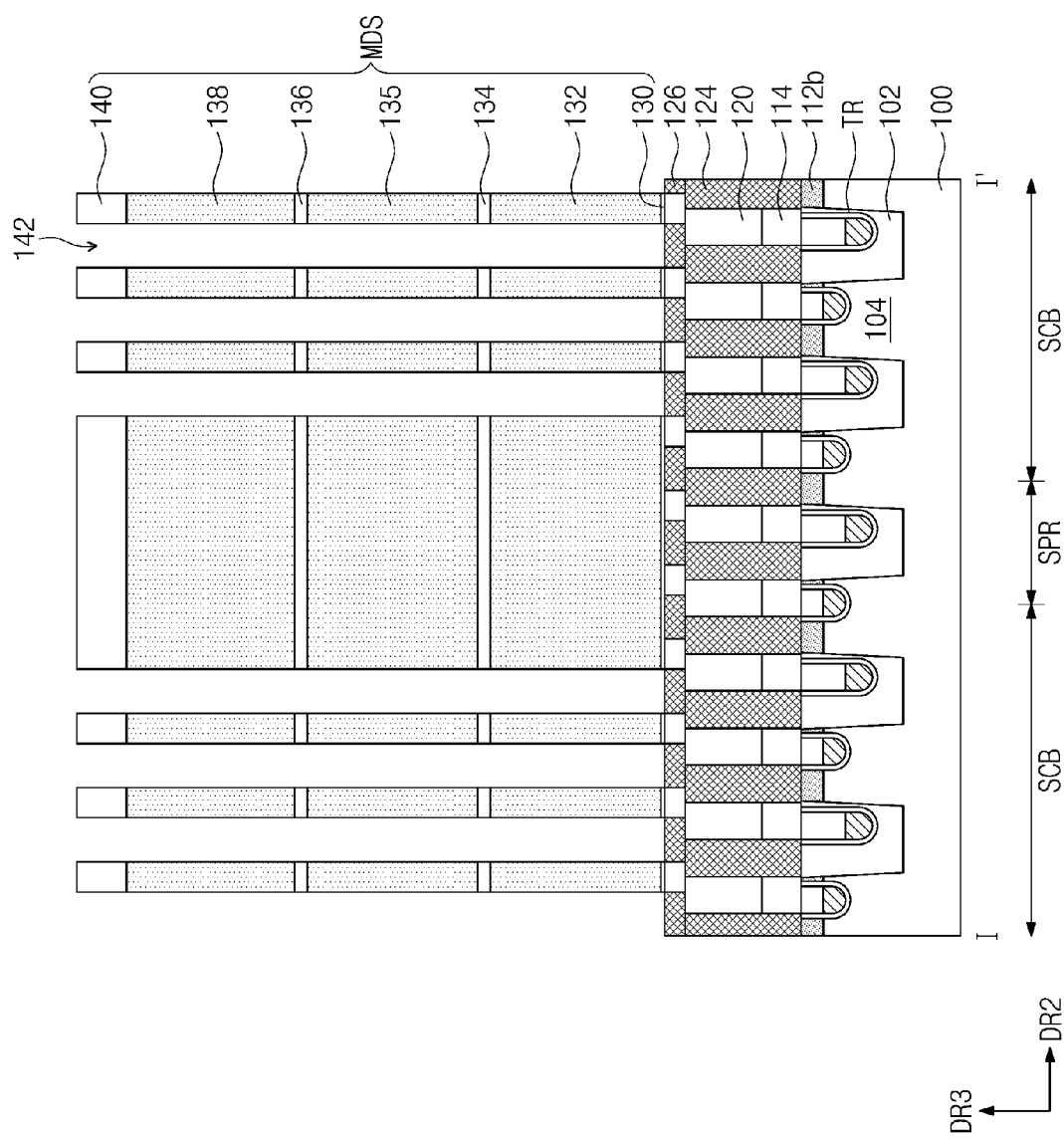

Referring to FIGS. 9A and 9B, the mold structure MDS may be etched to form third contact holes 142 exposing the contact pads 126.

In example embodiments, the third contact holes 142 may not be formed in the sub-peripheral regions SPR.

Figure 10A:
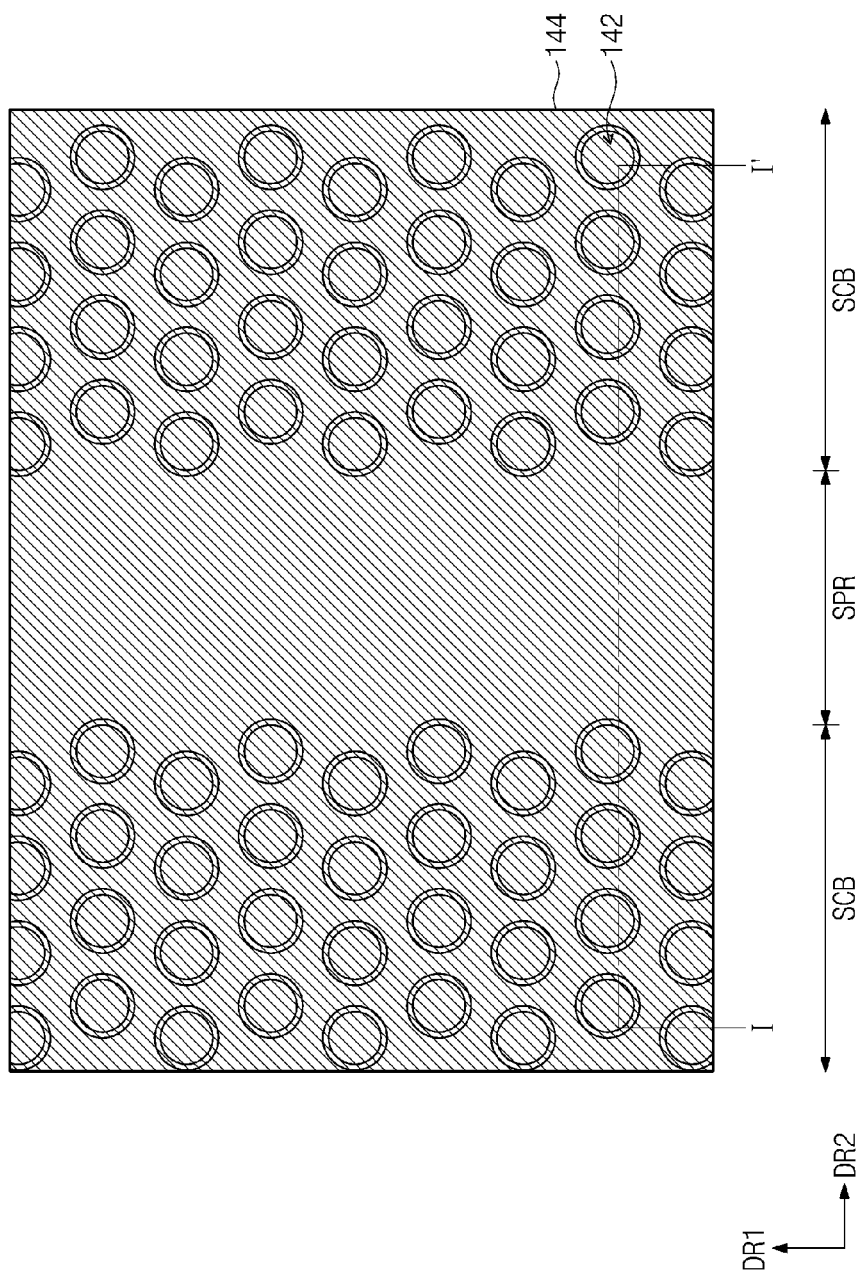
Figure 10B:
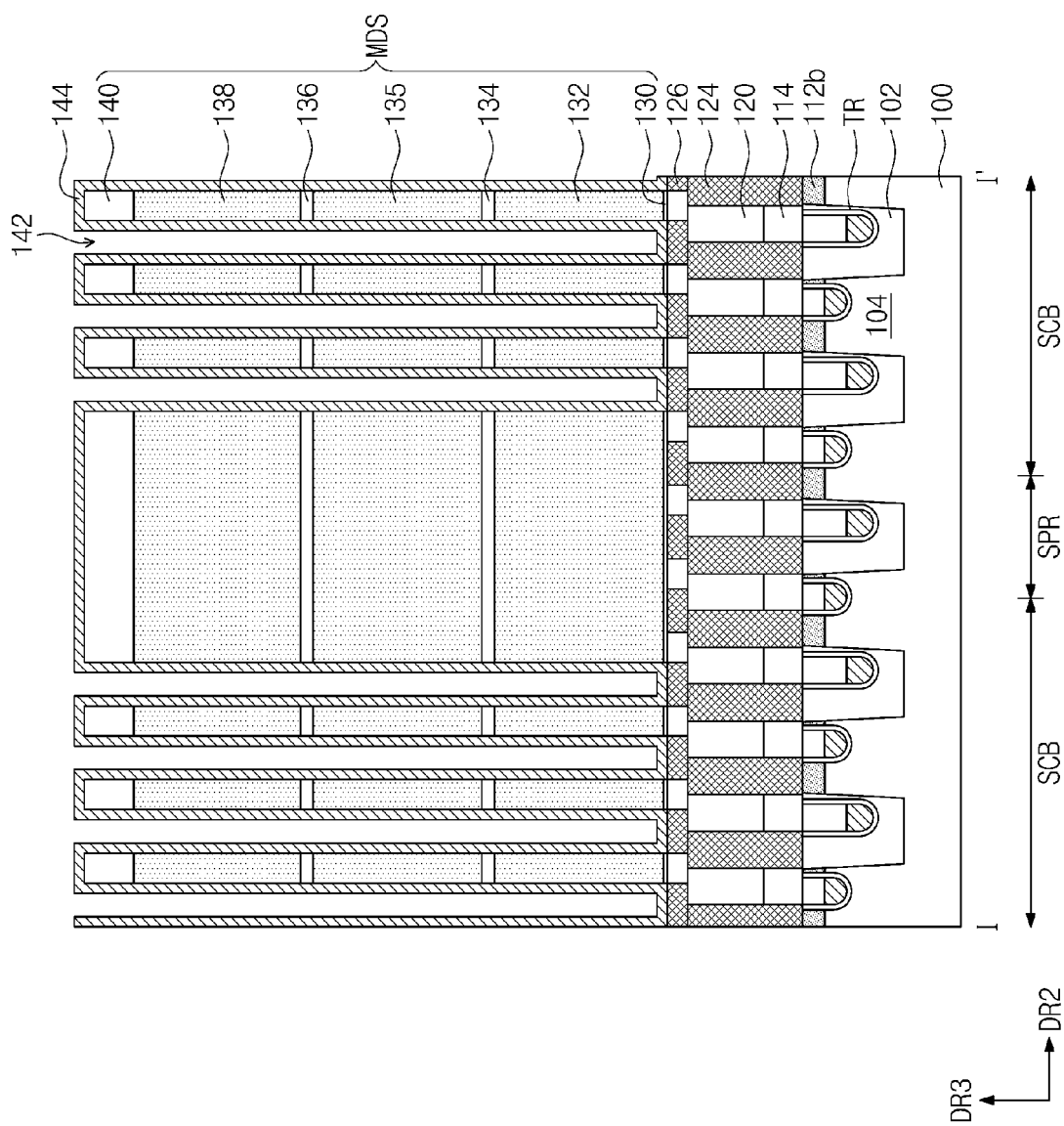

Referring to FIGS. 10A and 10B, a lower electrode layer 144 may be conformally formed on the mold structure MDS with the third contact holes 142. Here, the third contact holes 142 may not be completely filled with the lower electrode layer 144. The lower electrode layer 144 may be formed of or include doped silicon, metals (e.g., tungsten or copper), or metal compounds (e.g., titanium nitride).

Figure 11A:
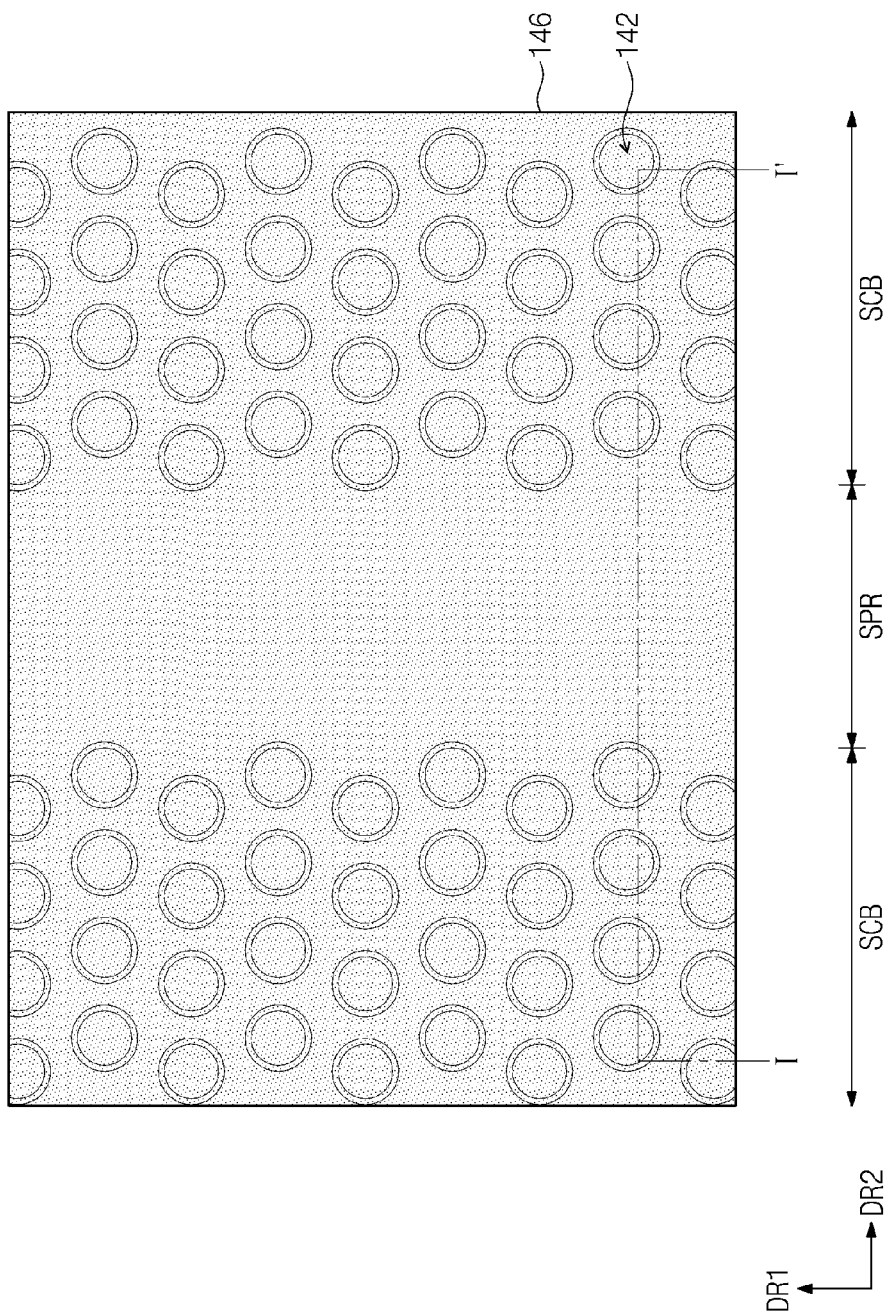
Figure 11B:
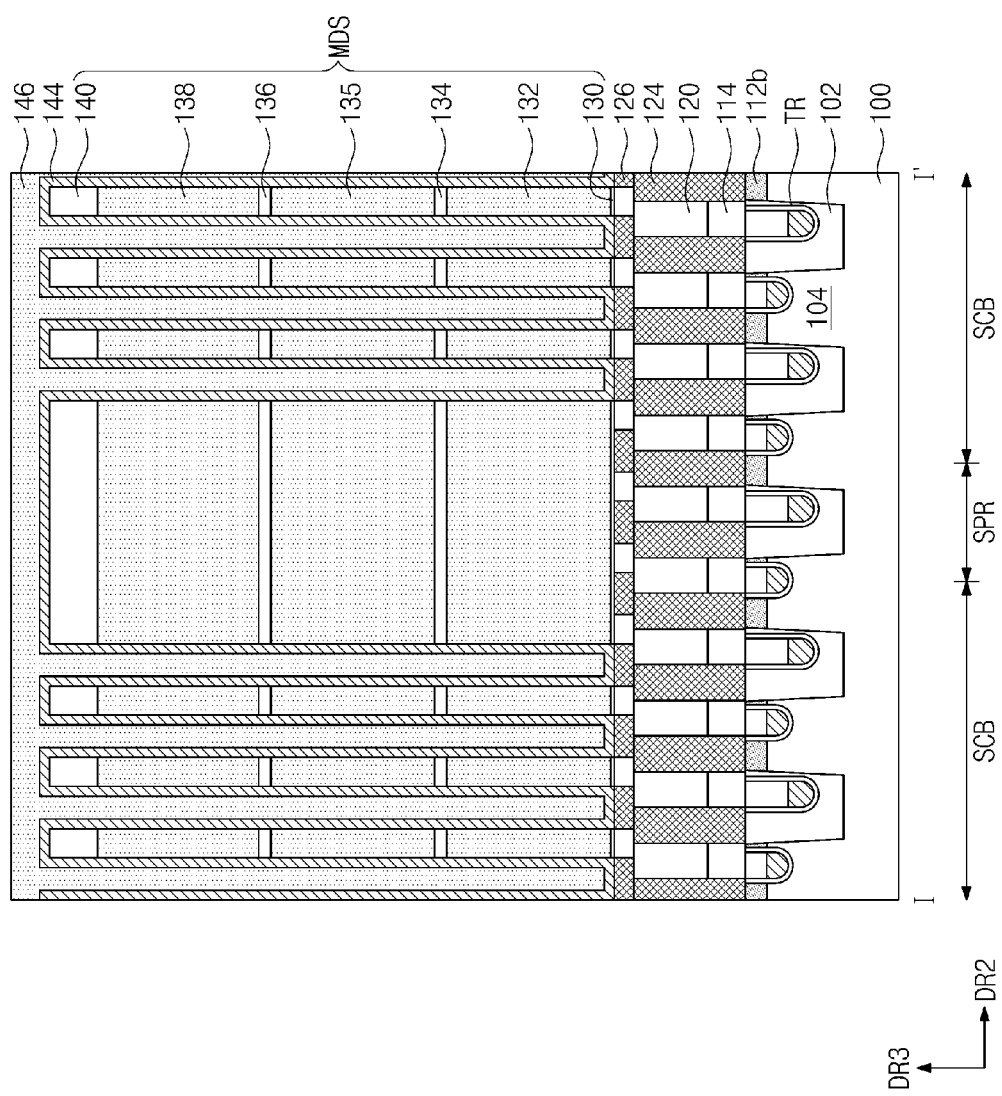

Referring to FIGS. 11A and 11B, a fourth sacrificial layer 146 may be formed to fill the third contact holes 142 provided with the lower electrode layer 144. The fourth sacrificial layer 146 may be formed of or include substantially the same material as that of the first to third sacrificial layers 132, 135, and 138. For example, the fourth sacrificial layer 146 may be formed of or include at least one of oxide-based materials (e.g., silicon oxide).

Figure 12A:
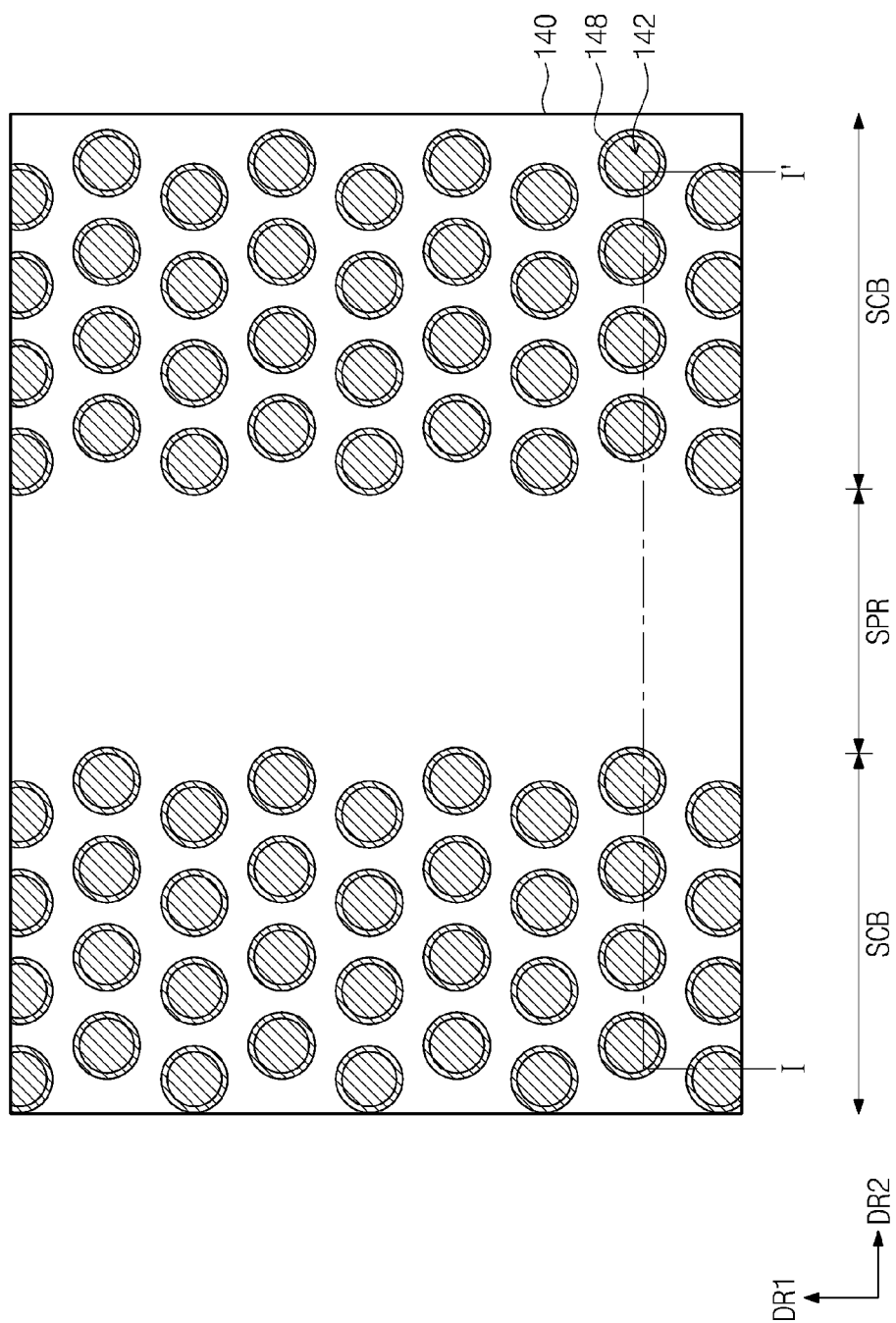
Figure 12B:
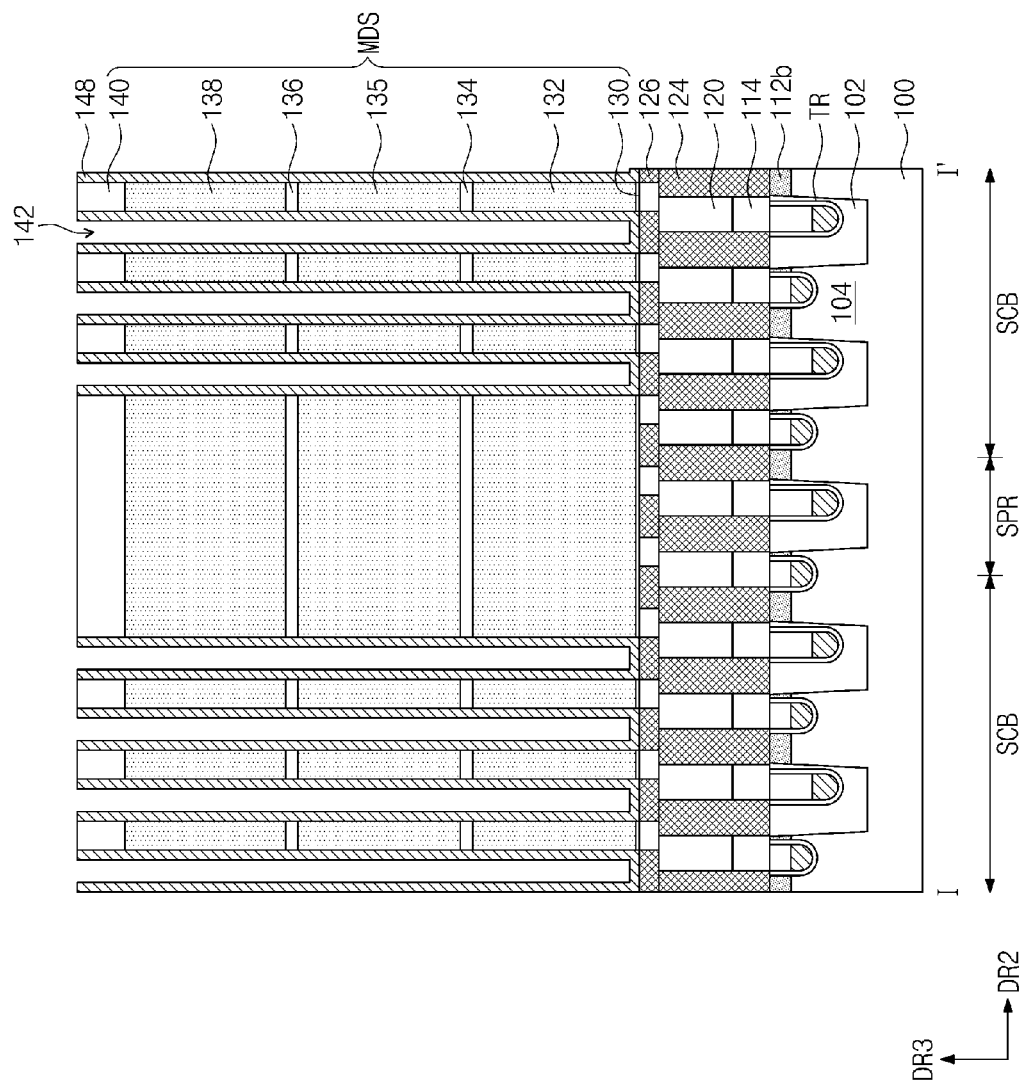

Referring to FIGS. 12A and 12B, the fourth sacrificial layer 146 and the lower electrode layer 144 may be planarized to expose a top surface of the mold structure MDS and thus, the lower electrodes 148 spaced apart from each other may be formed. As a result of the planarization process, an upper portion of the lower electrode layer 144 may be removed to form the lower electrodes 148 separated from each other. Each of the lower electrodes 148 may be formed to have a vertical section having a bottom-closed cylindrical shape.

Next, the fourth sacrificial layer 146 may be removed from the third contact holes 142. In other example embodiments, the fourth sacrificial layer 146 may be removed when the first to third sacrificial layers 132, 135, and 138 are removed.

Figure 13A:
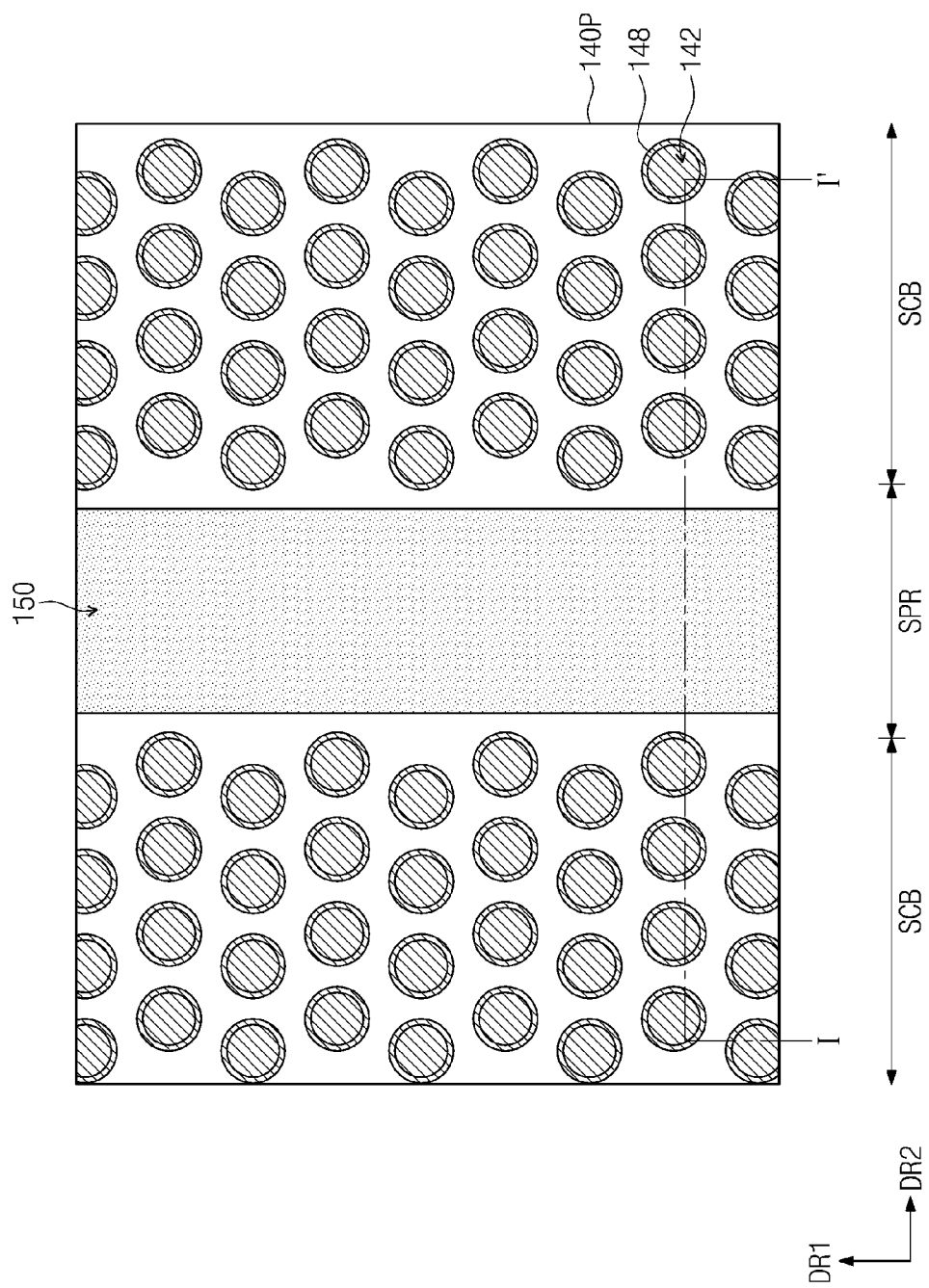
Figure 13B:
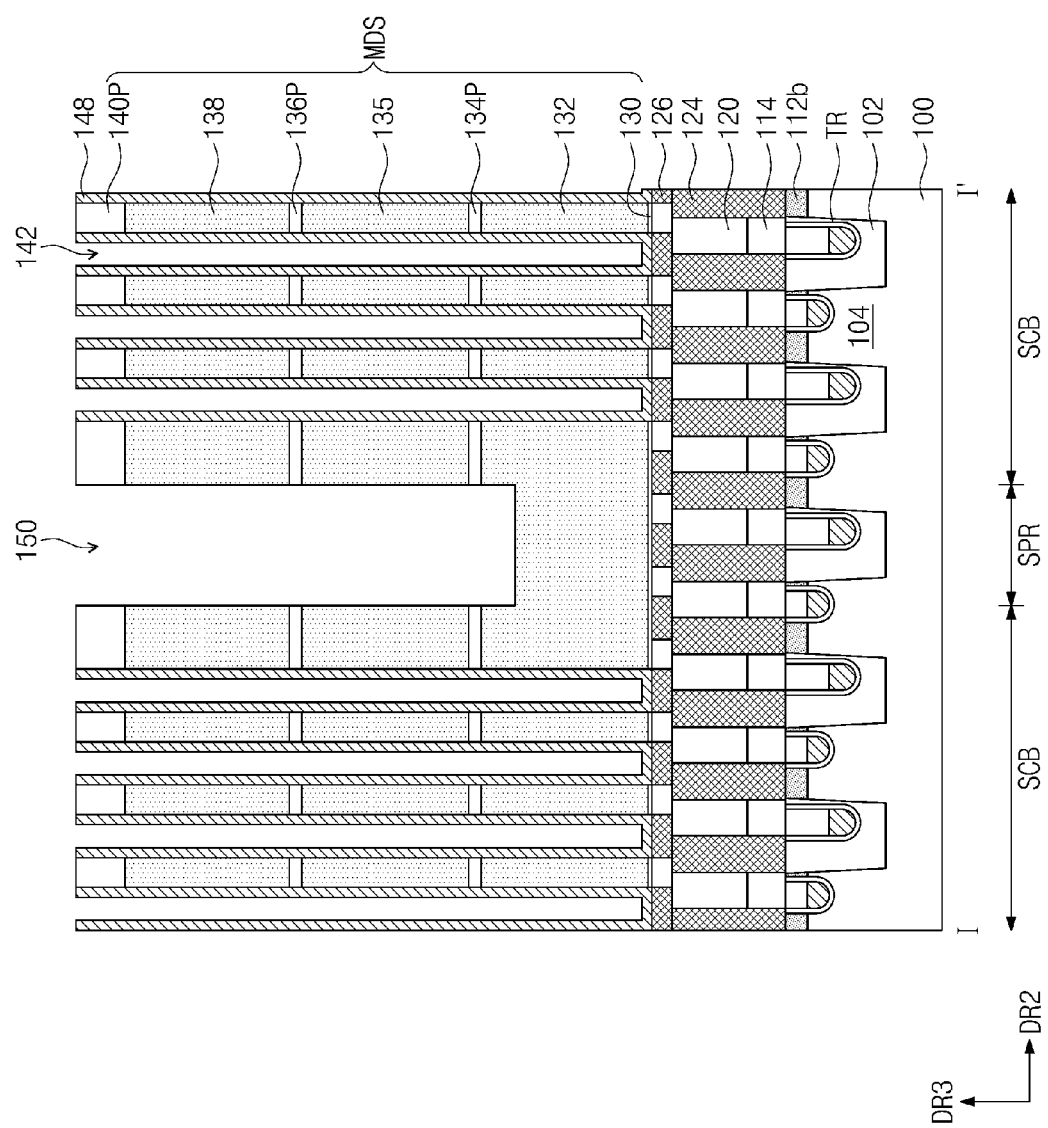

Referring to FIGS. 13A and 13B, a portion of the mold structure MDS on the sub-peripheral regions SPR may be partially etched to form a second trench 150 crossing the mold structure MDS.

In example embodiments, the third supporting layer 140, third sacrificial layer 138, the second supporting layer 136, the second sacrificial layer 135, and the first supporting layer 134 of the mold structure MDS may be etched to expose at least a portion of the first sacrificial layer 132.

The second trench 150 formed by the etching process may expose at least a portion of each of the first to third sacrificial layers 132, 135, and 138. Furthermore, the first to third supporting layers 134, 136, and 140 may be etched to form a first supporting pattern 134P, a second supporting pattern 136P, and a third supporting pattern 140P, respectively. As shown in FIG. 13B, each of the first to third supporting patterns 134P, 136P, and 140P may be provided between the lower electrodes 148 to prevent the lower electrodes 148 from leaning. The number of the supporting patterns may be changed, depending on a vertical length of the lower electrodes 148.

Figure 14A:
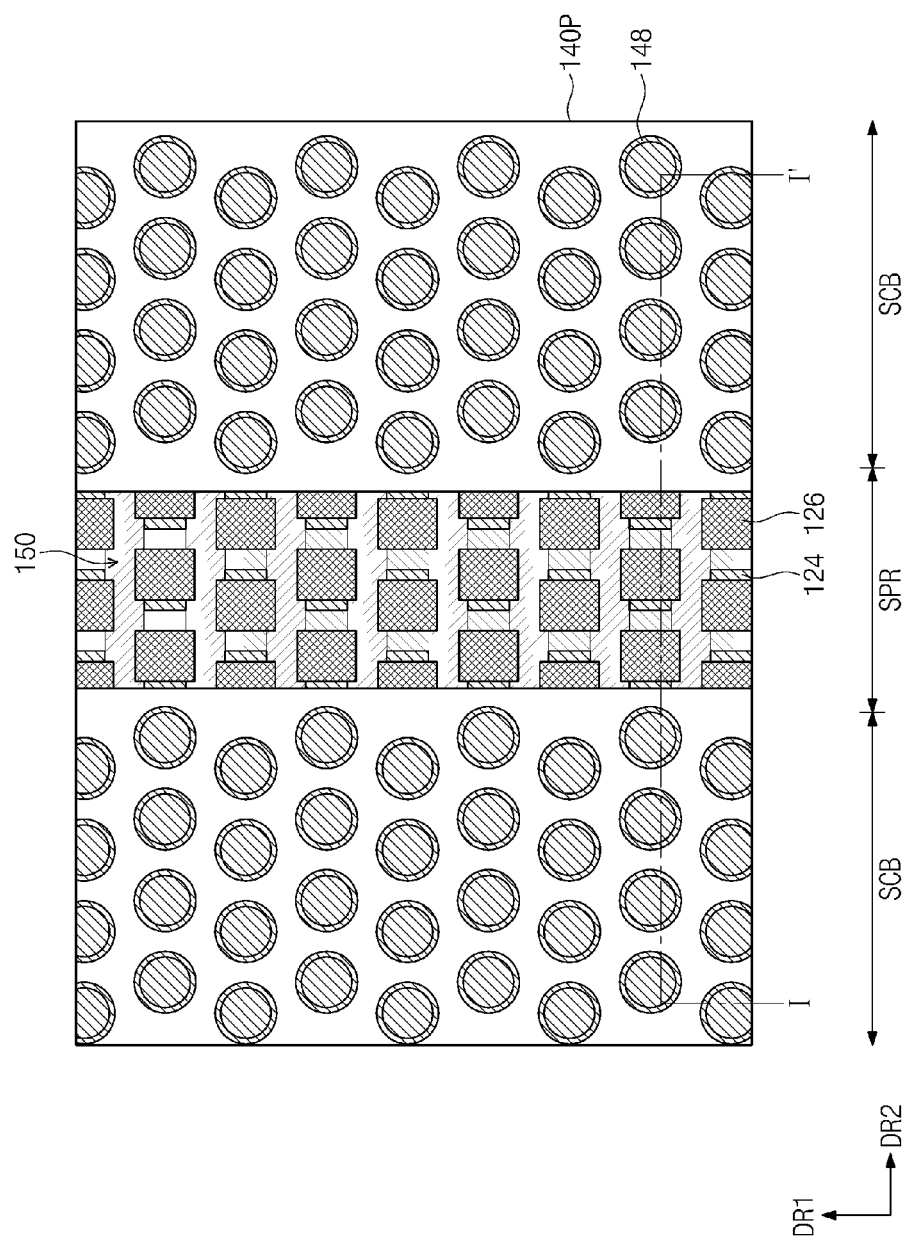
Figure 14B:
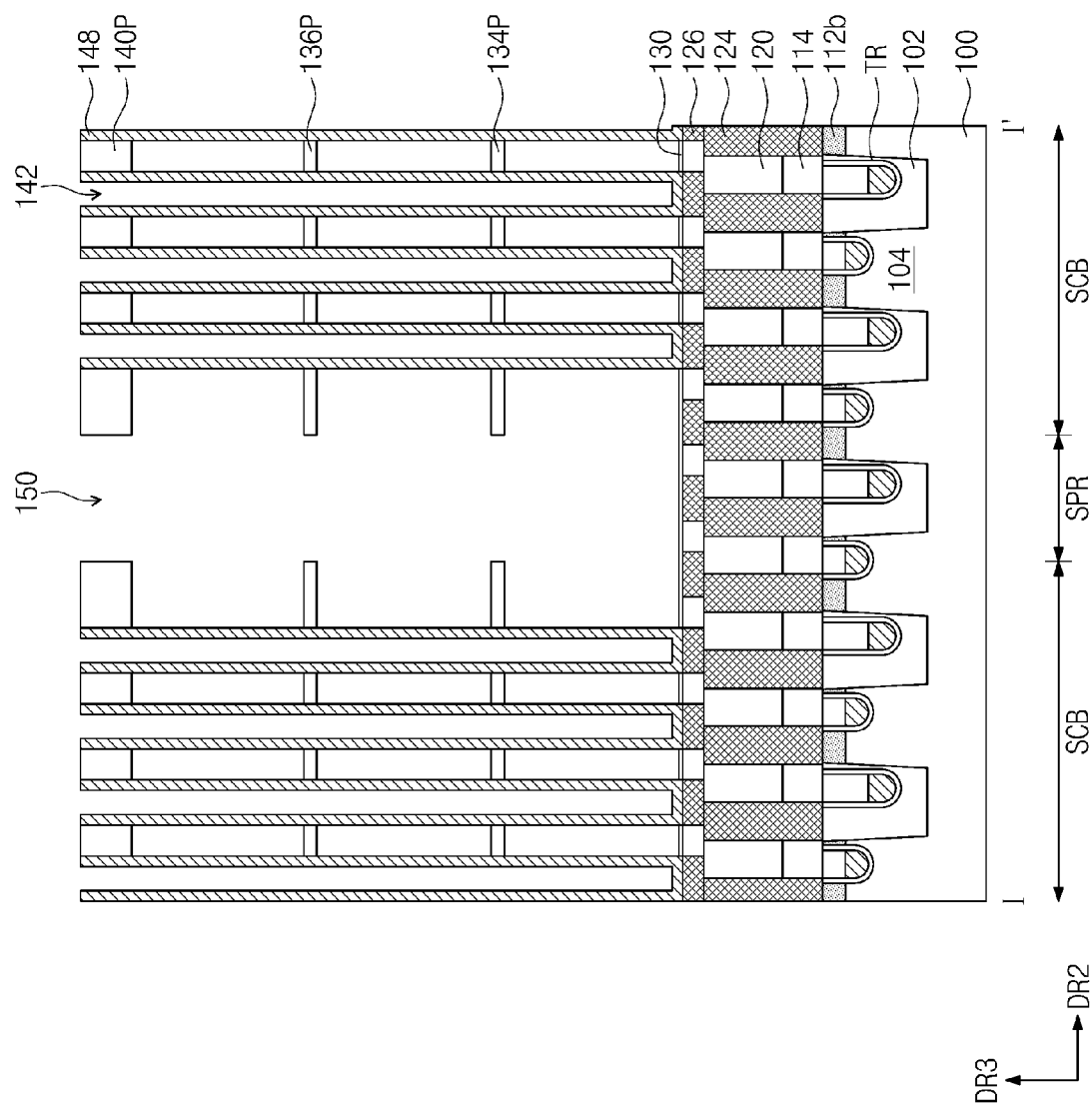

Referring to FIGS. 14A and 14B, the first to third sacrificial layers 132, 135, and 138 may be removed.

For example, the first to third sacrificial layers 132, 135, and 138 exposed by the second trench 150 may be removed by a wet etching process. An etchant used for the wet etching process may be selected to have a high etch rate with respect to the first to third sacrificial layers 132, 135, and 138 and a very low etch rate with respect to the etch stop layer 130 and the first to third supporting patterns 134P, 136P, and 140P.

According to the conventional technology, first to third supporting patterns may be formed by repeating a process of etching a third supporting layer, removing a third sacrificial layer, etching a second supporting layer, and removing a second sacrificial layer, without the formation of a second trench, such as described according to example embodiments of the inventive concept. In the case of the conventional process, since the etching steps are repeatedly performed, lower electrodes may be partially etched to cause a reduction in capacitance of the capacitors CAP. Furthermore, according to the conventional process, each of the supporting patterns may be formed by etching a corresponding one of the supporting layers, and this may lead to a difficulty in forming vertically-stacked supporting layers. In addition, the supporting layers may be unintentionally etched, and this may make it difficult for the supporting layers to enclose or support outer sidewalls of the lower electrodes.

By contrast, according to example embodiments of the inventive concept, the second trench 150 may allow for all of the first to third sacrificial layers 132, 135, and 138 to be removed at once, and thus, the first supporting pattern 134P may have a plate-shaped structure with the third contact holes 142. Similarly, each of the second and third supporting patterns 136P and 140P may also have a plate-shaped structure with the third contact holes 142. Accordingly, the outer sidewalls of the lower electrodes 148 can be completely enclosed or robustly supported by each of the first to third supporting patterns 134P, 136P, and 140P.

Figure 15A:
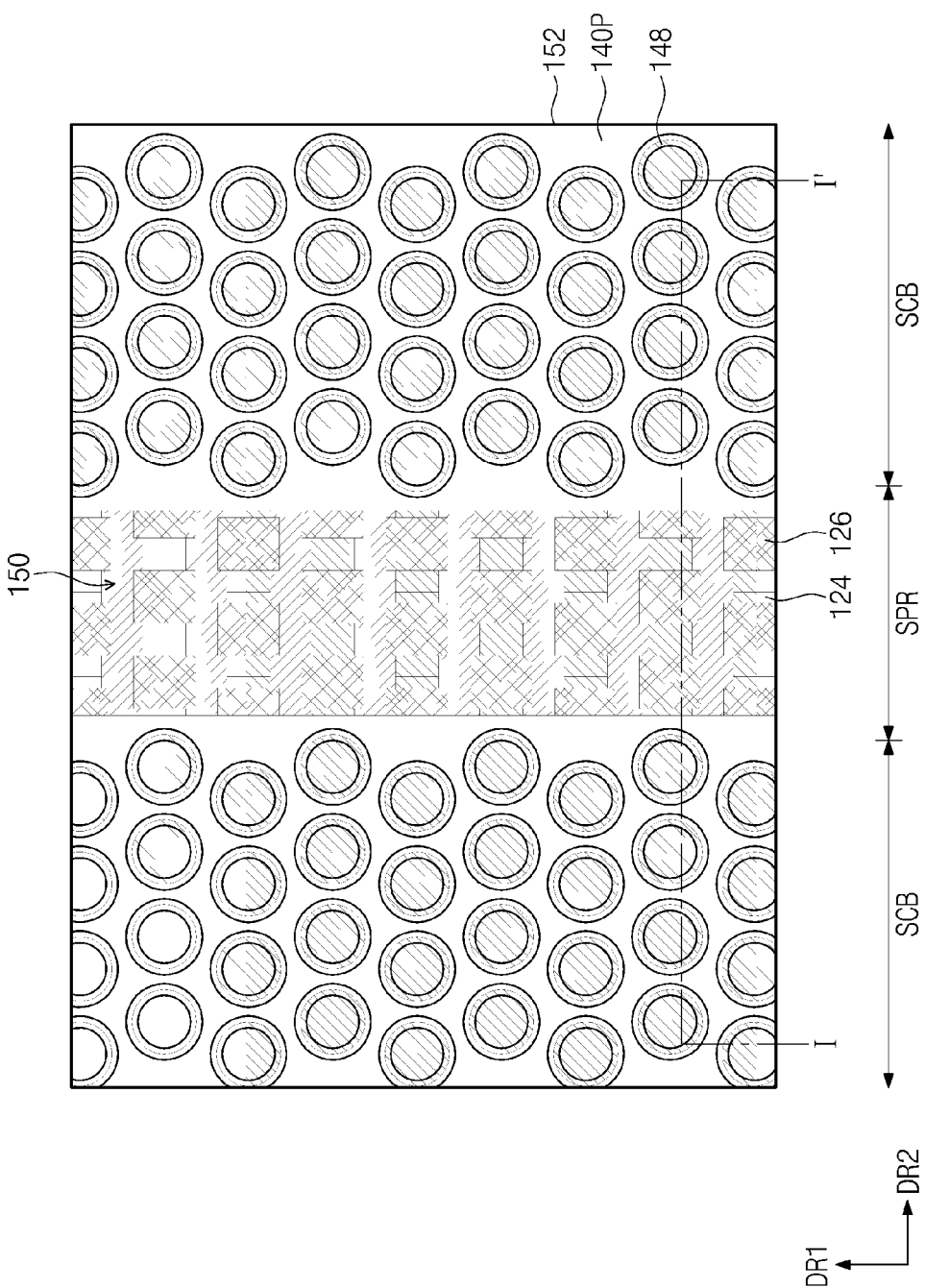
Figure 15B:
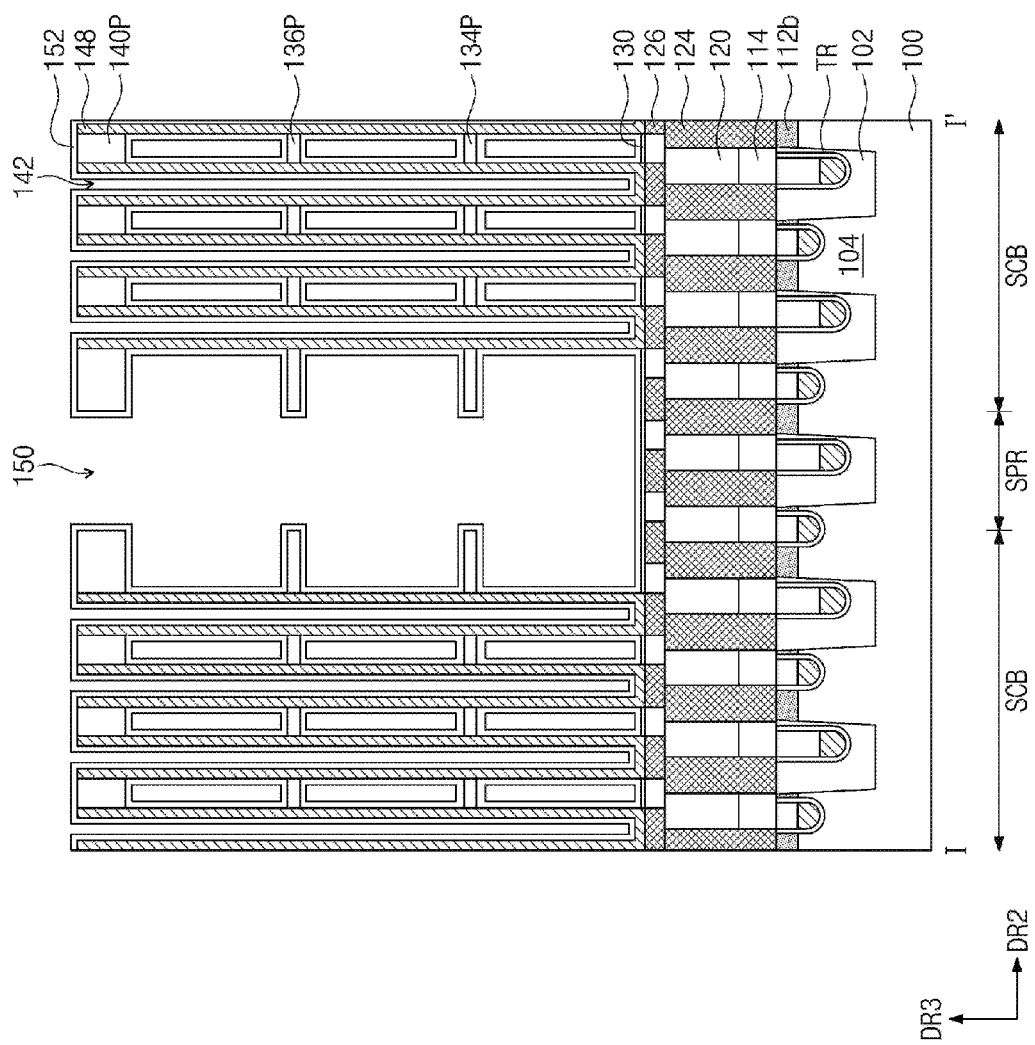

Referring to FIGS. 15A and 15B, a dielectric layer 152 may be conformally formed on the lower electrodes 148 and the first to third supporting patterns 134P, 136P, and 140P. The dielectric layer 152 may be formed of or include, for example, at least one of, silicon oxide, low-k dielectric materials, or high-k dielectric materials (e.g., aluminum oxide, zirconium oxide, or hafnium oxide).

Figure 16B:
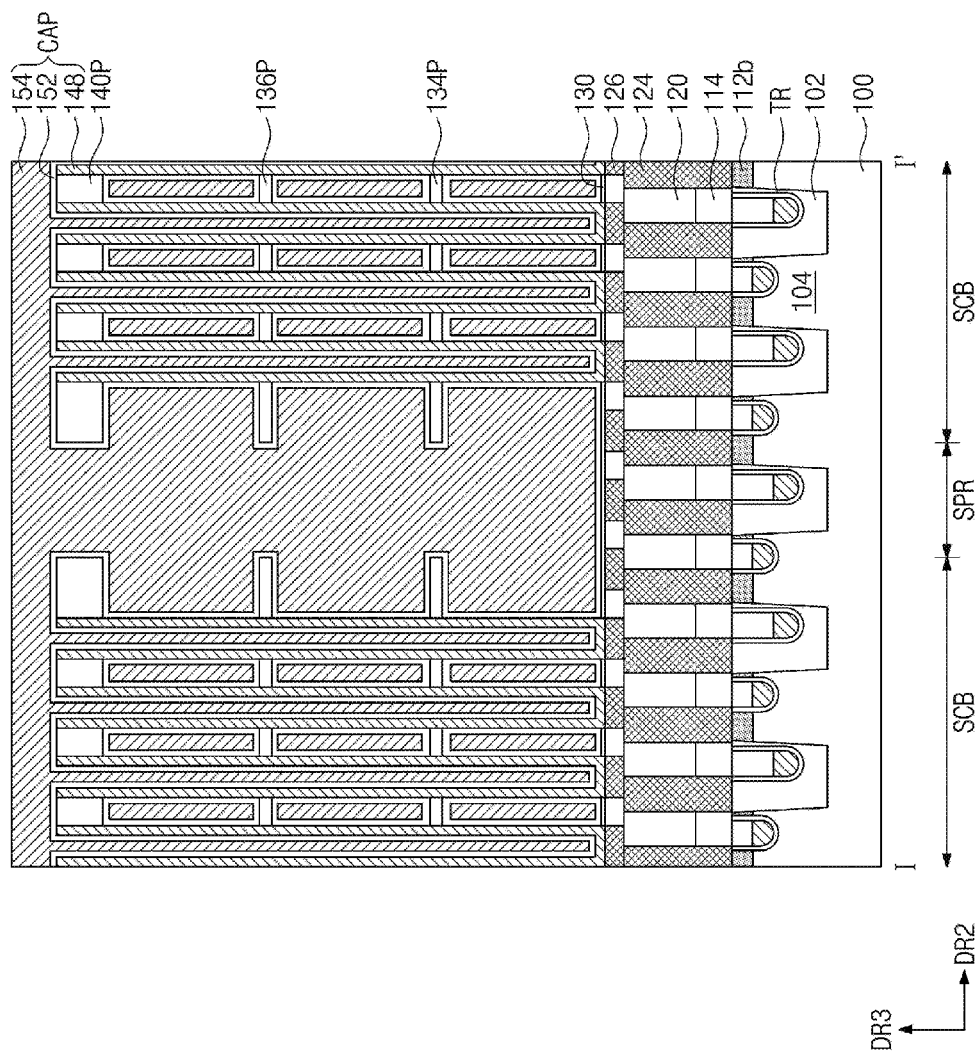

Referring to FIGS. 16A and 16B, an upper electrode layer 154 may be formed on the dielectric layer 152. The upper electrode layer 154 may include, for example, doped silicon, metals (e.g., tungsten or copper), or metal compounds (e.g., titanium nitride).

As a result, it is possible to form the capacitors CAP, each including the lower electrodes 148, the dielectric layer 152 and the upper electrode layer 154.

Figure 17:
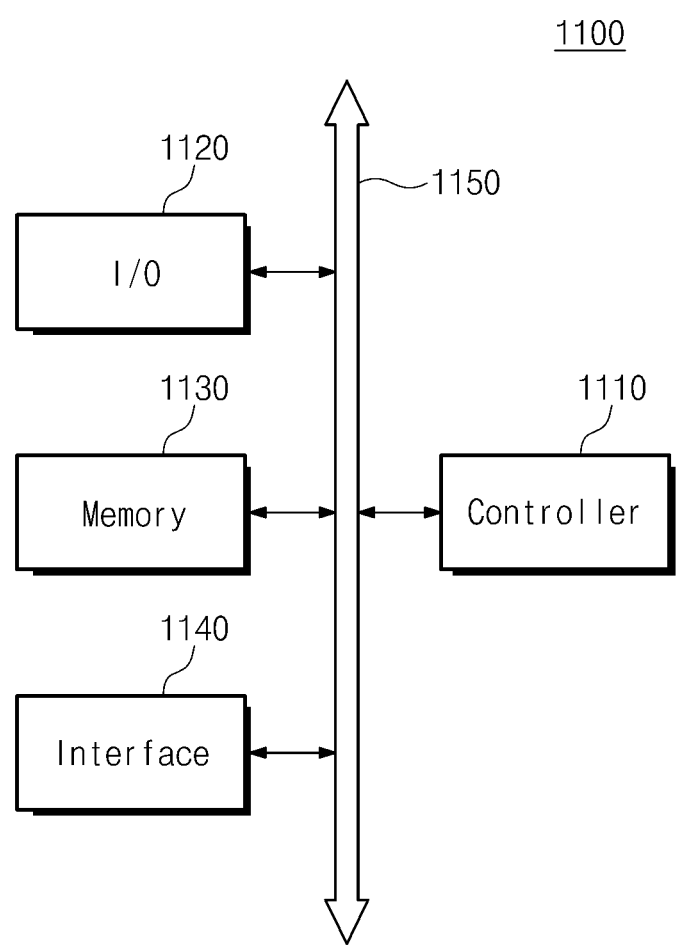
FIG. 17 is a schematic block diagram illustrating an example of electronic systems including a semiconductor device according to example embodiments of the inventive concept.

FIG. 17 is a schematic block diagram illustrating an example of electronic systems including a semiconductor device according to example embodiments of the inventive concept.

Referring to FIG. 17, an electronic system 1100 may include a controller 1110, an input-output (I/O) unit 1120, a memory device 1130, an interface 1140, and a bus 1150. The controller 1110, the input-output unit 1120, the memory device 1130 and/or the interface 1140 may be connected or coupled to each other via the bus 1150 serving as a pathway for data communication. At least one of the controller 1110, the input-output unit 1120, the memory device 1130, and/or the interface 1140 may include a semiconductor device according to example embodiments of the inventive concept.

The controller 1110 may include, e.g., at least one of a microprocessor, a digital signal processor, a microcontroller, or another logic device, which is configured to have a similar function to any one of the microprocessor, the digital signal processor, and the microcontroller. The input-output unit 1120 may include a keypad, keyboard, a display device, and so forth. The memory device 1130 may be configured to store data and/or command. The interface unit 1140 may transmit electrical data to a communication network or may receive electrical data from a communication network. The interface unit 1140 may operate in a wireless or wireless manner. For example, the interface unit 1140 may include an antenna for wireless communication or a wireless transceiver for wireless communication. Although not shown in the drawings, the electronic system 1100 may further include a fast DRAM device and/or a fast SRAM device which acts as a cache memory for improving an operation of the controller 1110.

The electronic system 1100 may be applied to an electronic device such as a personal digital assistant (PDA), a portable computer, a web tablet, a wireless phone, a mobile phone, a digital music player, a memory card, or an electronic product, which is configured to receive or transmit information data wirelessly.

Figure 18:
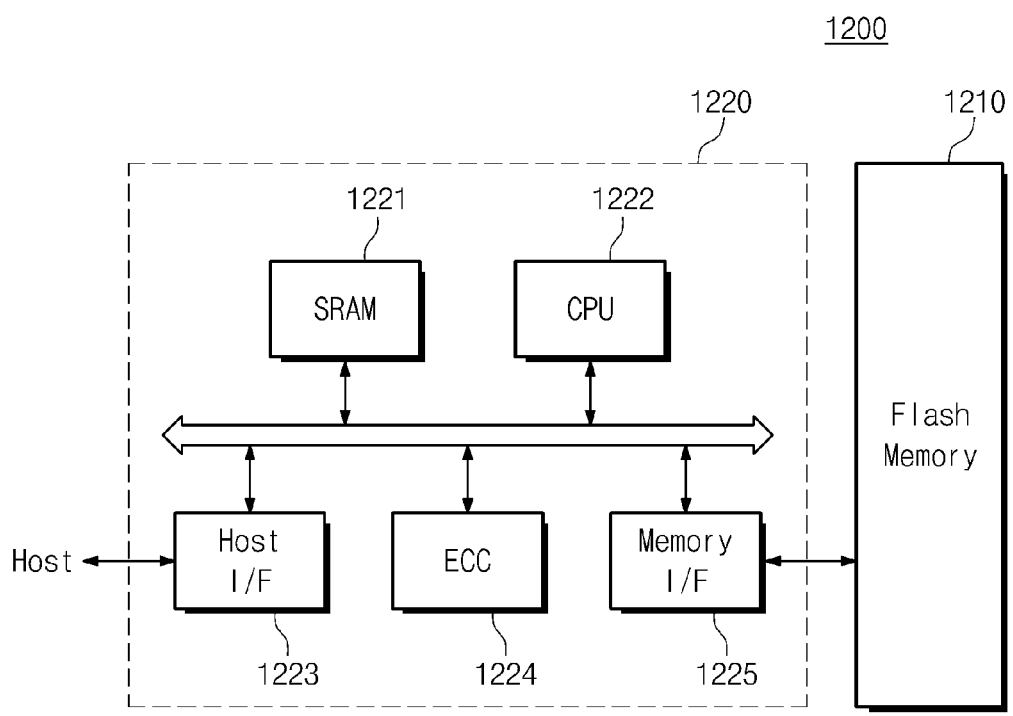
FIG. 18 is a schematic block diagram illustrating an example of memory cards including a semiconductor device according to example embodiments of the inventive concept.

FIG. 18 is a schematic block diagram illustrating an example of memory cards including a semiconductor device according to example embodiments of the inventive concept.

Referring to FIG. 18, at least one semiconductor memory device 1210 according to example embodiments of the inventive concept may be used in an electronic device such as a memory card 1200 with a large memory capacity. The memory card 1200 may include a memory controller 1220 configured to control a data exchange operation between a host and the semiconductor memory device 1210.

A static random access memory (SRAM) 1221 may be used as an operation memory of a processing unit 1222. A host interface 1223 may include data exchange protocols of a host to be connected to the memory card 1200. An error correction block 1224 may be configured to detect and correct errors included in data readout from a multi bit semiconductor memory device 1210. A memory interface 1225 may be configured to interface with the semiconductor memory device 1210. The processing unit 1222 may perform every control operation for exchanging data of the memory controller 1220. The different units and blocks described herein may be implemented with various circuits, and thus may be described as circuits. Even though not depicted in drawings, the memory card 1200 according to example embodiments of the inventive concept may further include a ROM (not shown) storing code data for interfacing with the host.

According to example embodiments of the inventive concept, a supporting pattern may be formed using a sub-peripheral region, and thus, it is possible to prevent several technical problems (for example, loss of a lower electrode or degradation in function of the supporting pattern) that may occur when the supporting pattern is formed. Furthermore, since the supporting pattern can be formed to have a multi-layered structure, it is possible to prevent the lower electrode from leaning, even when the lower electrode has a large vertical length.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
   a substrate including a cell region and a main peripheral region, the cell region having a plurality of sub-cell blocks spaced apart from each other by a plurality of opening regions and the main peripheral region surrounding the cell region;
   first word lines that are buried in the substrate of each of the sub-cell blocks;
   at least one second word line that is buried in the substrate of each of the opening regions;
   a plurality of lower electrodes having a bottom-closed cylindrical shape in each of the sub-cell blocks,
   a first supporting pattern provided to support lower portions of outer sidewalls of the lower electrodes in each of the sub-cell blocks;
   a second supporting pattern provided to support upper portions of the outer sidewalls of the lower electrodes in each of the sub-cell blocks; and
   a dielectric layer conformally covering inner and outer sidewalls of the lower electrodes, and an upper electrode on the dielectric layer,
   wherein:
   each of the first and second supporting patterns has a plate-shaped structure to surround all of the lower electrodes which are located in each of the sub-cell blocks;
   the lower electrodes, the first supporting pattern and the second supporting pattern do not exist in each of the opening regions; and
   the dielectric layer covers the at least one second word line in each of the opening regions.

2. The device of claim 1, wherein the upper electrode is provided to cover the inner and outer sidewalls of the lower electrode covered with the dielectric layer.

3. The device of claim 1, wherein outer sidewalls of the first and second supporting patterns are aligned with a boundary of the sub-cell block.

4. The device of claim 1, wherein each of the opening regions has a width that is two to five times a distance between centers of an adjacent pair of the lower electrodes.

5. The device of claim 1, further comprising:
a plurality of transistors on the substrate and electrically and respectively connected to the lower electrodes; and
a plurality of bit lines, each of the bit lines being connected to the transistors,
wherein each of the transistors comprises a gate electrode composed of a part of each of the first word lines.

6. The device of claim 5, wherein the substrate further comprises a device isolation pattern defining a plurality of active regions, and
wherein each of the transistors further comprises:
a gate insulating layer disposed between the gate electrode and the substrate; and
first and second impurity regions in the active region and at opposite sides of the gate electrode, respectively.

7. The device of claim 6, wherein the bit lines are electrically connected to the first impurity regions and extend in a direction perpendicular to the first word lines.

8. The device of claim 6, wherein each of the lower electrodes is electrically and respectively connected to the second impurity regions.

9. The device of claim 6, further comprising:
contact plugs contacting the second impurity regions, respectively, and
contact pads interposed between the contact plugs and the lower electrodes, respectively,
wherein each of the contact pads is shifted or offset with respect to a corresponding one of the contact plugs.

10. The device of claim 6, wherein:
the first word lines pass through the device isolation patterns; and
bottom surfaces of the first word lines are higher in the active region than in the device isolation patterns.

11. The device of claim 6, wherein the bit lines cross over the at least one second word line.

12. The device of claim 1, wherein a distance between the first word lines is substantially equal to a distance between the at least one second word line and the first word line that is closest to the at least one second word line out of the first word lines.

* * * * *